US011751491B2

(12) United States Patent
Lauer et al.

(10) Patent No.: US 11,751,491 B2
(45) Date of Patent: Sep. 5, 2023

(54) HEAVY-HEX CONNECTION TOPOLOGY TO RECTILINEAR PHYSICAL LAYOUT

(71) Applicant: International Business Machines Corporation, Armonk, NY (US)

(72) Inventors: Isaac Lauer, Chappaqua, NY (US); Neereja Sundaresan, Mount Kisco, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 477 days.

(21) Appl. No.: 16/935,698

(22) Filed: Jul. 22, 2020

(65) Prior Publication Data
US 2022/0028927 A1 Jan. 27, 2022

(51) Int. Cl.
*G06N 10/00* (2022.01)
*H10N 69/00* (2023.01)
*H10N 60/12* (2023.01)
*H10N 60/01* (2023.01)

(52) U.S. Cl.
CPC ............ *H10N 69/00* (2023.02); *G06N 10/00* (2019.01); *H10N 60/0912* (2023.02); *H10N 60/12* (2023.02)

(58) Field of Classification Search
CPC ... H01L 27/18; H01L 39/223; H01L 39/2493; G06N 10/00
See application file for complete search history.

(56) References Cited

U.S. PATENT DOCUMENTS

| 10,248,491 | B1 | 4/2019 | Zeng et al. |
| 10,467,544 | B2 | 11/2019 | Filipp et al. |
| 2019/0296211 | A1 | 9/2019 | Chow et al. |
| 2020/0161529 | A1 | 5/2020 | Chow et al. |
| 2021/0125094 | A1* | 4/2021 | Chamberland ........ G06N 10/00 |

FOREIGN PATENT DOCUMENTS

| WO | 2019/173651 A1 | 9/2019 |
| WO | 2019/178009 A1 | 9/2019 |

OTHER PUBLICATIONS

Chamberland et al., "Triangular color codes on trivalent graphs with flag qubits," New Journal of Physics, vol. 22, https://iopscience.iop.org/article/10.1088/1367-2630/ab68fd, Feb. 7, 2020, 24 pages.
(Continued)

*Primary Examiner* — Jung Kim
(74) *Attorney, Agent, or Firm* — Amin, Turocy & Watson, LLP

(57) ABSTRACT

Systems and techniques that facilitate mapping a heavy-hex qubit connection topology to a rectilinear physical qubit layout are provided. In various embodiments, a device can comprise a qubit lattice on a substrate. In various aspects, the qubit lattice can comprise one or more first qubit tiles. In various cases, the one or more first qubit tiles can have a first shape. In various instances, the qubit lattice can further comprise one or more second qubit tiles. In various cases, the one or more second qubit tiles can have a second shape. In various aspects, the one or more first qubit tiles can be tessellated with the one or more second qubit tiles.

20 Claims, 11 Drawing Sheets

(56) References Cited

OTHER PUBLICATIONS

Chamberland et al., "Topological and Subsystem Codes on Low-Degree Graphs with Flag Qubits," Physical Review X 10, 011022, 2020, 19 pages.
U.S. Appl. No. 16/542,094, filed Aug. 15, 2019.
U.S. Appl. No. 16/512,143, filed Jul. 15, 2019.
International Search Report and Written Opinion received for PCT Application Serial No. PCT/EP2021/070454 dated Nov. 10, 2021, 14 pages.
Reply to International Search Report and Written Opinion for PCT Application Serial No. PCT/EP2021/070454 filed Feb. 17, 2023, 4 pages.

* cited by examiner

HEAVY-HEX CONNECTION TOPOLOGY TO RECTILINEAR PHYSICAL LAYOUT

BACKGROUND

The subject disclosure relates to qubit connection topology, and more specifically to mapping a heavy-hex qubit connection topology to a rectilinear physical qubit layout.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, computer-implemented methods, apparatus and/or computer program products that facilitate mapping a heavy-hex qubit connection topology to a rectilinear physical qubit layout are described.

According to one or more embodiments, a device is provided. In various embodiments, the device can comprise a qubit lattice on a substrate. In various aspects, the qubit lattice can comprise one or more first qubit tiles. In various cases, the one or more first qubit tiles can have a first shape. In various instances, the qubit lattice can further comprise one or more second qubit tiles. In various cases, the one or more second qubit tiles can have a second shape. In various aspects, the one or more first qubit tiles can be tessellated with the one or more second qubit tiles. In various embodiments, the qubit lattice can exhibit a rectilinear physical layout. In various embodiments, the one or more first qubit tiles tessellated with the one or more second qubit tiles can form a heavy-hex qubit connection topology in the rectilinear physical layout of the qubit lattice. In various embodiments, one of the one or more first qubit tiles can have twelve qubits and twelve interqubit connection buses. In various cases, one of the one or more second qubit tiles can have twelve qubits and twelve interqubit connection buses. In various embodiments, adjacent qubit tiles in the heavy-hex qubit connection topology can share three qubits. In various embodiments, a qubit tile in the heavy-hex qubit connection topology can be adjacent to four qubit tiles having a different shape than the qubit tile. In various cases, the qubit tile can be adjacent to two qubit tiles having a same shape as the qubit tile.

According to one or more embodiments, a method is provided. The method can comprise forming a qubit lattice on a substrate. In various aspects, the qubit lattice can comprise one or more first qubit tiles. In various cases, the one or more first qubit tiles can have a first shape. In various instances, the qubit lattice can further comprise one or more second qubit tiles. In various cases, the one or more second qubit tiles can have a second shape. In various aspects, the one or more first qubit tiles can be tessellated with the one or more second qubit tiles. In various embodiments, the qubit lattice can exhibit a rectilinear physical layout. In various embodiments, the one or more first qubit tiles tessellated with the one or more second qubit tiles can form a heavy-hex qubit connection topology in the rectilinear physical layout of the qubit lattice. In various embodiments, one of the one or more first qubit tiles can have twelve qubits and twelve interqubit connection buses. In various cases, one of the one or more second qubit tiles can have twelve qubits and twelve interqubit connection buses. In various embodiments, adjacent qubit tiles in the heavy-hex qubit connection topology can share three qubits. In various embodiments, a qubit tile in the heavy-hex qubit connection topology can be adjacent to four qubit tiles having a different shape than the qubit tile. In various cases, the qubit tile can be adjacent to two qubit tiles having a same shape as the qubit tile.

According to one or more embodiments, an apparatus is provided. In various embodiments, the apparatus can comprise a qubit array on a substrate. In various cases, the qubit array can exhibit a rectilinear physical qubit arrangement. In various aspects, the qubit array can comprise a plurality of first qubit tiles having a first shape tessellated with a plurality of second qubit tiles having a second shape. In various embodiments, the plurality of first qubit tiles tessellated with the plurality of second qubit tiles can form a heavy-hex qubit connection topology in the rectilinear physical qubit arrangement of the qubit array.

DETAILED DESCRIPTION

Figure 1:
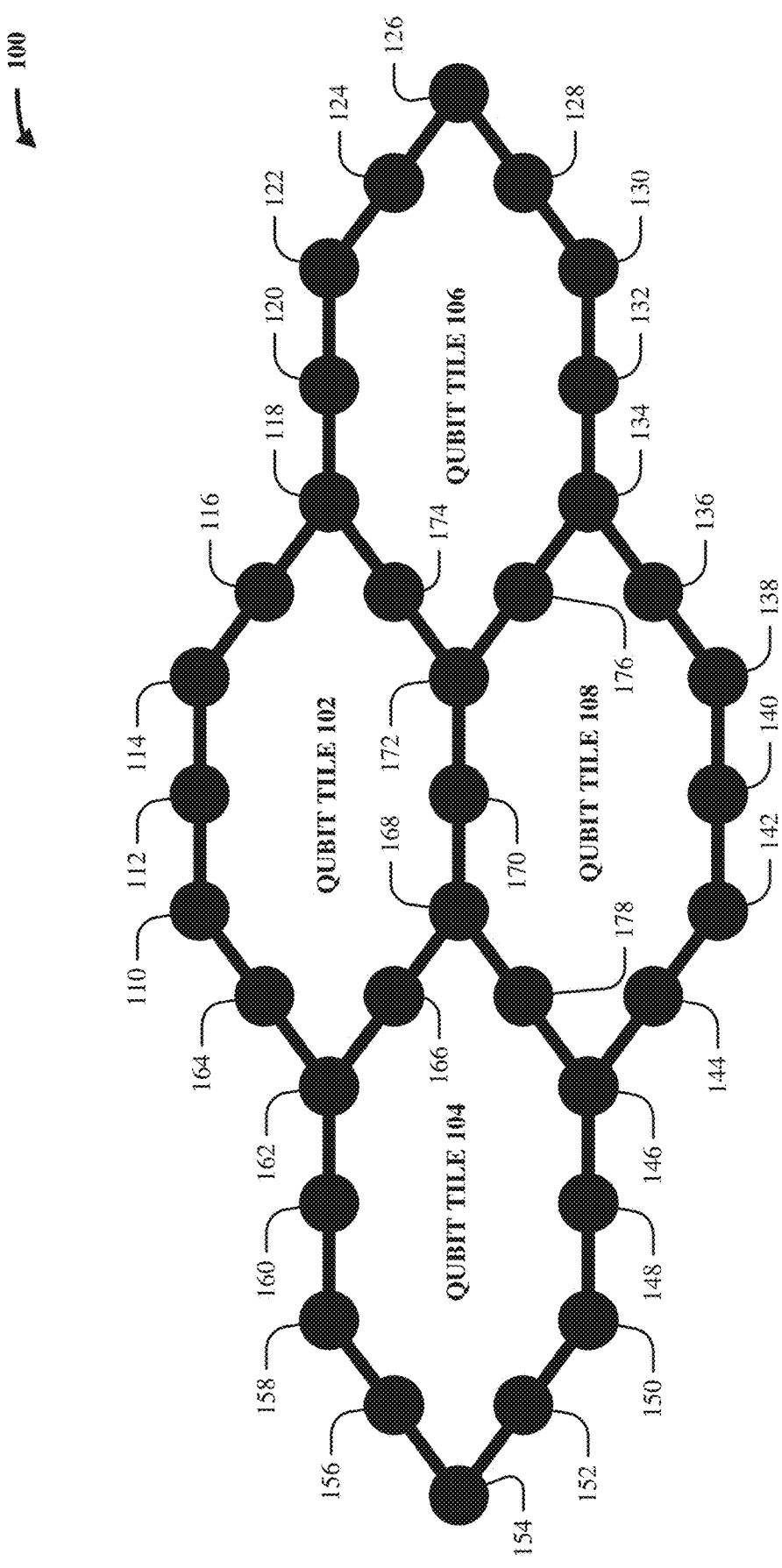
FIG. 1 illustrates a block diagram of an example, non-limiting heavy-hex qubit connection topology implemented with a heavy-hex physical qubit layout.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Modern quantum computing systems can implement quantum error correcting codes as a method of error suppression. Specifically, a quantum computing system can include one or more quantum chips on which two-dimensional lattices, arrays, arrangements, and/or layouts of qubits are physically located. In various cases, the qubits in such two-dimensional lattices, arrays, arrangements, and/or layouts can be interconnected via any suitable number and/or arrangement of interqubit connection buses (e.g., microwave resonators). In various cases, quantum error correcting codes can be defined on such two-dimensional lattices, arrays, arrangements, and/or layouts of qubits, and the design of any particular quantum error correcting code can rely on the underlying connection topology (also referred to as "connectivity") of the qubits in a two-dimensional lattice, array, arrangement, and/or layout (e.g., can depend upon the number and/or arrangement of interqubit connection buses in the two-dimensional lattice, array, arrangement, and/or layout).

Note that, in various aspects, a qubit connection topology can be separate and/or distinct from a physical qubit lattice, array, arrangement, and/or layout. Specifically, the physical lattice, array, arrangement, and/or layout of qubits on a quantum chip can describe how the qubits are physically positioned and/or located on the quantum chip (e.g., arranged in a rectangular grid, circular grid, polygonal grid, irregular grid) and/or can describe the physical shapes of and/or physical distances traversed by the interqubit connection buses that connect the qubits on the quantum chip (e.g., the interqubit connection buses can be straight, curved, long, short). In contrast, the connection topology of the qubits on the quantum chip can describe how the qubits are connected with one another regardless of physical position and/or location of the qubits on the quantum chip and/or regardless of the physical shapes of and/or physical distances traversed by the interqubit connection buses. For example, consider a quantum computing chip that has four qubits: qubit 1, qubit 2, qubit 3, and qubit 4. Furthermore, suppose that qubit 1 is coupled to qubit 3, which is coupled to qubit 2, which is coupled to qubit 4. This is a particular connection topology (e.g., 1-3-2-4) of the four qubits on the quantum chip. Note that this particular connection topology does not depend upon the physical positions and/or locations of the four qubits on the quantum chip and/or does not depend upon the physical shapes of and/or physical distances traversed by the interqubit connection buses that connect the four qubits on the quantum chip. In other words, the four qubits can have this particular connection topology (e.g., 1-3-2-4) regardless of whether the four qubits are physically arranged in the shape of a square, a rectangle, a trapezoid, a rhombus, a line, and/or a curve and regardless of whether the four qubits are physically near each other and/or are physically spaced apart by microns, millimeters, centimeters, and/or decimeters. This non-limiting, illustrative example helps to highlight the distinct between the connection topology of a set of interconnected qubits and the physical layout and/or arrangement of the set of interconnected qubits.

In various cases, a heavy-hex connection topology can be an attractive choice for implementing quantum error correcting codes. In various instances, a heavy-hex connection topology can be physically implemented with a heavy-hex physical lattice, array, arrangement, and/or layout of qubits. In various aspects, a heavy-hex physical lattice, array, arrangement, and/or layout of qubits can be formed by physically positioning and/or locating the qubits in the shape of a hexagonal grid on the quantum chip (e.g., the qubits can be physically arranged according to a grid of tessellated hexagons, where each hexagon in the grid has twelve total qubits with a qubit physically positioned/located at each vertex of the hexagon and a qubit physically positioned/located along each line segment and/or leg of the hexagon, and where adjacent hexagons share qubits and/or interqubit connection buses).

In various instances, although a heavy-hex connection topology can be desirable for the execution of quantum error correcting codes, a heavy-hex physical lattice, array, arrangement, and/or layout of qubits can include much wasted space on the quantum chip. Specifically, the physical surface area of the quantum chip that is within, encompassed, and/or circumscribed by each hexagon of the hexagonal grid can be unused (e.g., empty portions of surface area that could be used for other qubits and/or other circuit components) and thus can be considered as wasted real estate. So, a heavy-hex physical lattice, array, arrangement, and/or layout of qubits can be spatially inefficient and/or suboptimal from a fabrication and/or quantum chip real estate perspective. In various cases, systems and/or techniques that can address one or more of these technical problems can be desirable.

Various embodiments of the invention can address one or more of these technical problems. Specifically, various embodiments of the invention can provide systems and/or techniques that can facilitate mapping a heavy-hex qubit connection topology to a rectilinear physical qubit layout. As mentioned above, a heavy-hex qubit connection topology can be desirable for the implementation of quantum error correcting codes, but a heavy-hex physical qubit layout (e.g., a physical hexagonal grid) can be spatially inefficient from a fabrication and/or quantum chip real estate perspective. In contrast, a rectilinear physical qubit layout (e.g., where the qubits are physically positioned on the quantum chip in a rectilinear grid having regular and/or repeating rows and columns) can be more spatially efficient than a heavy-hex physical qubit layout. Specifically, since a rectilinear grid is composed of regular and/or repeating rows and columns of qubits, a rectilinear grid can densely fill with qubits the interior surface area of the quantum chip that is normally left unused by a hexagonal grid. In other words, a rectilinear physical qubit layout can help to minimize layout surface area for a quantum chip (e.g., can help to more densely arrange qubits on the quantum chip so that less space is unused and thus wasted). Moreover, minimizing layout surface area in such way can help to reduce and/or save on fabrication costs (e.g., it can be easier and/or cheaper to manufacture rectilinear grids of qubits than to manufacture hexagonal grids of qubits), can help in matching transmission line lengths to allowable frequency ranges (e.g., more densely-packed qubits can be connected via shorter interqubit connection buses, and shorter interqubit connection buses can exhibit higher resonant frequencies and/or more resonant frequencies that are in desirable operating bands), and/or can help in avoiding parasitic radio frequency modes associated with the size of the quantum chip (e.g., since the qubits themselves can be more densely packed on the quantum chip when a rectilinear physical layout is used, a wider range of physical sizes of the quantum chip itself can become available, and so a quantum chip size that helps to avoid and/or minimize parasitic losses can be implemented). Furthermore, such a rectilinear physical qubit layout can be highly regular, which means that the quantum circuits designed on such a rectilinear physical qubit layout can be easily scaled up and/or scaled down based on the desired size of the quantum chip, and which can help to minimize the number of distinct quantum circuit structures that need to be simulated during research and development. Thus, implementing a heavy-hex qubit connection topology in a rectilinear physical qubit layout can allow for the execution of superior quantum error correcting codes without the spatial inefficiency associated with heavy-hex physical qubit layouts.

The inventors of various embodiments of the invention recognized how a heavy-hex qubit connection topology can be mapped to a rectilinear physical qubit layout. Specifically, in various instances, a rectilinear qubit lattice can be formed on a quantum substrate (e.g., silicon wafer). In various cases, the rectilinear qubit lattice can be a square, rectangular, and/or orthogonal two-dimensional array of qubits, such that the qubits are arranged into regular and/or repeating rows and columns on the quantum substrate. In various aspects, interqubit connection buses can be strategically placed between qubits in the rectilinear qubit lattice to define a first set of qubit tiles having a first shape and to define a second set of qubit tiles having a second shape, with the first shape being different from the second shape. In various cases, each of the first set of qubit tiles can represent a heavy-hex unit cell. Similarly, in various cases, each of the second set of qubit tiles can represent a heavy-hex unit cell. In various instances, the first set of qubit tiles and the second set of qubit tiles can be tessellated in the rectilinear qubit lattice, such that the qubits on the quantum chip are physically positioned in regular and/or repeating rows and columns and yet collectively exhibit a heavy-hex connection topology. In some cases, a qubit tile can comprise a plurality of qubits (e.g., twelve qubits) that are connected together in a particular arrangement, shape, and/or fashion (e.g., where each qubit in the qubit tile is connected to two adjacent qubits in the qubit tile, thereby forming a closed-loop qubit tile). In some cases, more than two sets of differently-shaped qubit tiles can be tessellated to map a heavy-hex connection topology to a rectilinear physical qubit layout.

Various embodiments of the invention can be employed to use hardware and/or software to solve problems that are highly technical in nature (e.g., to facilitate mapping a heavy-hex qubit connection topology to a rectilinear physical qubit layout), that are not abstract and that cannot be performed as a set of mental acts by a human. Indeed, various embodiments of the invention can constitute real-world, physical quantum structures that can be fabricated on a real-world quantum substrate in order to implement a heavy-hex qubit connection topology with a rectilinear physical qubit layout. Such real-world, physical quantum structures certainly are not abstract, are not laws of nature, and are not natural phenomena. Moreover, various embodiments of the invention can integrate into a practical application the teachings disclosed herein. Indeed, in various embodiments, the disclosed teachings can facilitate the fabrication of quantum chips that can implement quantum error correcting codes using heavy-hex connection topologies but that lack the spatial inefficiencies normally associated with heavy-hex physical qubit layouts. Specifically, since the herein disclosure teaches how to implement a heavy-hex qubit connection topology by using a rectilinear physical qubit layout, the herein disclosure can facilitate the manufacture of quantum chips that have more densely-packed qubits than quantum chips that implement heavy-hex physical qubit layouts. Thus, embodiments of the invention can facilitate the creation of quantum chips that have less wasted chip real estate but that can nonetheless be used to implement heavy-hex-based quantum error correcting codes. As mentioned above, reducing the amount of wasted surface area on a quantum chip in such manner can result in commensurate cost reductions, can make it easier to keep resonant frequencies of transmission lines and/or interqubit connection buses in desired operating ranges, and/or can help to reduce a number of parasitic radio frequency modes. In other words, embodiments of the invention can facilitate the fabrication of quantum chips that exhibit improved quantum performance. Thus, embodiments of the invention constitute a concrete and tangible technical improvement in the field of quantum connection topology.

The teachings disclosed herein are inherently geometrical, and thus the accompanying figures and/or drawings can be helpful in understanding various embodiments of the invention. In various aspects, the figures and/or drawings accompanying this disclosure are exemplary, non-limiting, and not necessarily drawn to scale.

FIG. 1 illustrates a block diagram of an example, non-limiting heavy-hex qubit connection topology implemented with a heavy-hex physical qubit layout 100. As shown, the heavy-hex physical qubit layout 100 can include a plurality of qubits 110-178 (denoted by the black dots in FIG. 1) that can be coupled together via a plurality of interqubit connection buses (denoted by the black lines between adjacent qubits in FIG. 1). As shown, the qubits 110-178 can, in various cases, be coupled together so that they are physically arranged and/or laid-out according to a heavy-hex grid pattern. In other words, the qubits 110-178 can be physically arranged and/or coupled so that they form four qubit tiles 102-108 that are each in the physical shape of a hexagon. In still other words, the four qubit tiles 102-108 can be hexagonally-shaped in a physical sense and can be tessellated to form the heavy-hex physical qubit layout 100.

As shown, each of the four qubit tiles 102-108 can, in various cases, include twelve qubits and twelve interqubit connection buses. Specifically, the qubit tile 102 can be composed of the qubit 110, the qubit 112, the qubit 114, the qubit 116, the qubit 118, the qubit 174, the qubit 172, the qubit 170, the qubit 168, the qubit 166, the qubit 162, and the qubit 164. As shown, the qubit 110 can be considered as a first vertex of the qubit tile 102, the qubit 114 can be considered as a second vertex of the qubit tile 102, the qubit 118 can be considered as a third vertex of the qubit tile 102, the qubit 172 can be considered as a fourth vertex of the qubit tile 102, the qubit 168 can be considered as a fifth vertex of the qubit tile 102, and the qubit 162 can be considered as a sixth vertex of the qubit tile 102. Moreover, as shown, the qubit 110 can be coupled via an interqubit connection bus to the qubit 112, the qubit 112 can be coupled via an interqubit connection bus to the qubit 114, the qubit 114 can be coupled via an interqubit connection bus to the qubit 116, the qubit 116 can be coupled via an interqubit connection bus to the qubit 118, the qubit 118 can be coupled via an interqubit connection bus to the qubit 174, the qubit 174 can be coupled via an interqubit connection bus to the qubit 172, the qubit 172 can be coupled via an interqubit connection bus to the qubit 170, the qubit 170 can be coupled via an interqubit connection bus to the qubit 168, the qubit 168 can be coupled via an interqubit connection bus to the qubit 166, the qubit 166 can be coupled via an interqubit connection bus to the qubit 162, the qubit 162 can be coupled via an interqubit connection bus to the qubit 164, and the qubit 164 can be coupled via an interqubit connection bus to the qubit 110. In some cases, this qubit connection topology can be represented as 110-112-114-116-118-174-172-170-168-166-162-164-110.

Similarly, the qubit tile 104 can be composed of the qubit 158, the qubit 160, the qubit 162, the qubit 166, the qubit 168, the qubit 178, the qubit 146, the qubit 148, the qubit 150, the qubit 152, the qubit 154, and the qubit 156. As shown, the qubit 158 can be considered as a first vertex of the qubit tile 104, the qubit 162 can be considered as a second vertex of the qubit tile 104, the qubit 168 can be considered as a third vertex of the qubit tile 104, the qubit 146 can be considered as a fourth vertex of the qubit tile 104, the qubit 150 can be considered as a fifth vertex of the qubit tile 104, and the qubit 154 can be considered as a sixth vertex of the qubit tile 104. Moreover, as shown, the qubit 158 can be coupled via an interqubit connection bus to the qubit 160, the qubit 160 can be coupled via an interqubit connection bus to the qubit 162, the qubit 162 can be coupled via an interqubit connection bus to the qubit 166, the qubit 166 can be coupled via an interqubit connection bus to the qubit 168, the qubit 168 can be coupled via an interqubit connection bus to the qubit 178, the qubit 178 can be coupled via an interqubit connection bus to the qubit 146, the qubit 146 can be coupled via an interqubit connection bus to the qubit 148, the qubit 148 can be coupled via an interqubit connection bus to the qubit 150, the qubit 150 can be coupled via an interqubit connection bus to the qubit 152, the qubit 152 can be coupled via an interqubit connection bus to the qubit 154, the qubit 154 can be coupled via an interqubit connection bus to the qubit 156, and the qubit 156 can be coupled via an interqubit connection bus to the qubit 158. In some cases, this qubit connection topology can be represented as 158-160-162-166-168-178-146-148-150-152-154-156-158.

Likewise, the qubit tile 106 can be composed of the qubit 118, the qubit 120, the qubit 122, the qubit 124, the qubit 126, the qubit 128, the qubit 130, the qubit 132, the qubit 134, the qubit 176, the qubit 172, and the qubit 174. As shown, the qubit 118 can be considered as a first vertex of the qubit tile 106, the qubit 122 can be considered as a second vertex of the qubit tile 106, the qubit 126 can be considered as a third vertex of the qubit tile 106, the qubit 130 can be considered as a fourth vertex of the qubit tile 106, the qubit 134 can be considered as a fifth vertex of the qubit tile 106, and the qubit 172 can be considered as a sixth vertex of the qubit tile 106. Moreover, as shown, the qubit 118 can be coupled via an interqubit connection bus to the qubit 120, the qubit 120 can be coupled via an interqubit connection bus to the qubit 122, the qubit 122 can be coupled via an interqubit connection bus to the qubit 124, the qubit 124 can be coupled via an interqubit connection bus to the qubit 126, the qubit 126 can be coupled via an interqubit connection bus to the qubit 128, the qubit 128 can be coupled via an interqubit connection bus to the qubit 130, the qubit 130 can be coupled via an interqubit connection bus to the qubit 132, the qubit 132 can be coupled via an interqubit connection bus to the qubit 134, the qubit 134 can be coupled via an interqubit connection bus to the qubit 176, the qubit 176 can be coupled via an interqubit connection bus to the qubit 172, the qubit 172 can be coupled via an interqubit connection bus to the qubit 174, and the qubit 174 can be coupled via an interqubit connection bus to the qubit 118. In some cases, this qubit connection topology can be represented as 118-120-122-124-126-128-130-132-134-176-172-174-118.

Similarly, the qubit tile 108 can be composed of the qubit 168, the qubit 170, the qubit 172, the qubit 176, the qubit 134, the qubit 136, the qubit 138, the qubit 140, the qubit 142, the qubit 144, the qubit 146, and the qubit 178. As shown, the qubit 168 can be considered as a first vertex of the qubit tile 108, the qubit 172 can be considered as a second vertex of the qubit tile 108, the qubit 134 can be considered as a third vertex of the qubit tile 108, the qubit 138 can be considered as a fourth vertex of the qubit tile 108, the qubit 142 can be considered as a fifth vertex of the qubit tile 108, and the qubit 146 can be considered as a sixth vertex of the qubit tile 108. Moreover, as shown, the qubit 168 can be coupled via an interqubit connection bus to the qubit 170, the qubit 170 can be coupled via an interqubit connection bus to the qubit 172, the qubit 172 can be coupled via an interqubit connection bus to the qubit 176, the qubit 176 can be coupled via an interqubit connection bus to the qubit 134, the qubit 134 can be coupled via an interqubit connection bus to the qubit 136, the qubit 136 can be coupled via an interqubit connection bus to the qubit 138, the qubit 138 can be coupled via an interqubit connection bus to the qubit 140, the qubit 140 can be coupled via an interqubit connection bus to the qubit 142, the qubit 142 can be coupled via an interqubit connection bus to the qubit 144, the qubit 144 can be coupled via an interqubit connection bus to the qubit 146, the qubit 146 can be coupled via an interqubit connection bus to the qubit 178, and the qubit 178 can be coupled via an interqubit connection bus to the qubit 168. In some cases, this qubit connection topology can be represented as 168-170-172-176-134-136-138-140-142-144-146-178-168.

As shown, in various instances, adjacent qubit tiles in the heavy-hex physical qubit layout 100 can share qubits and/or can share interqubit connection buses. For example, as shown, the qubit tile 102 can share the qubit 162, the qubit 166, and the qubit 168 with the qubit tile 104. Moreover, the qubit tile 102 can share the interqubit connection bus that couples the qubit 162 to the qubit 166 and the interqubit connection bus that couples the qubit 166 to the qubit 168 with the qubit tile 104. As another example, the qubit tile 102 can share the qubit 172, the qubit 174, and the qubit 118 with the qubit tile 106. Moreover, the qubit tile 102 can share the interqubit connection bus that couples the qubit 172 to the qubit 174 and the interqubit connection bus that couples the qubit 174 to the qubit 118 with the qubit tile 106. As yet another example, the qubit tile 102 can share the qubit 168, the qubit 170, and the qubit 172 with the qubit tile 108.

Moreover, the qubit tile 102 can share the interqubit connection bus that couples the qubit 168 to the qubit 170 and the interqubit connection bus that couples the qubit 170 to the qubit 172 with the qubit tile 108. In various embodiments, any given qubit tile in the heavy-hex physical qubit layout 100 can share three qubits and/or two interqubit connection buses with any adjacent qubit tile in the heavy-hex physical qubit layout 100.

In various aspects, the qubits 110-178 can be any suitable types and/or any suitable combinations of types of qubit devices (e.g., any suitable superconducting qubit devices such as charge qubits, flux qubits, phase qubits, and/or transmon qubits, and/or any suitable non-superconducting qubit devices). In various aspects, the interqubit connection buses can be any suitable devices and/or any suitable combinations of devices for electrically coupling together two or more qubits (e.g., microwave resonators, direct couplers, capacitive couplers, waveguides).

In various embodiments, as mentioned above, the heavy-hex physical qubit layout 100 can exhibit a heavy-hex qubit connection topology. That is, each of the qubit tiles 102-108 can be composed of twelve qubits that are coupled into a close-loop via twelve interqubit connection buses, where adjacent qubit tiles can share with each other three qubits and two interqubit connection buses. As explained above, such a heavy-hex qubit connection topology can be desirable for the execution of heavy-hex-based quantum error correcting codes. However, as also explained above and as shown in FIG. 1, while the heavy-hex qubit connection topology is desirable in a topological sense, the heavy-hex physical qubit layout 100 is not spatially efficient in a physical sense (e.g., as explained above, connection topology is distinct from physical layout). Specifically, there is much wasted space in the middle and/or interior of each of the qubit tiles 102-108. In other words, the interior regions of each of the qubit tiles 102-108 can be considered as surface areas of a quantum substrate (not shown) which could be used productively to support other qubits and/or other quantum circuit devices, but which is not actually being used productively due to the hexagonal physical arrangement of the heavy-hex physical qubit layout 100 (e.g., due to the physical hexagonal shapes of the qubit tiles 102-108, substantial amounts of space are within each of the qubit tiles 102-108 and are left unused and/or wasted).

In various aspects, the inventors of various embodiments of the invention recognized that such wasted space can be caused by the fact that the qubits 110-178 are physically positioned and/or located according to a hexagonal grid and because the qubits 110-178 are not physically positioned and/or located according a more dense rectilinear grid (e.g., the qubits 110-178 are physically arranged in the shapes of tessellated hexagons and are not physically arranged in regular and/or repeating rows and columns in the heavy-hex physical qubit layout 100). Thus, the inventors of various embodiments of the invention recognized that such spatial inefficiencies can be eliminated by physically arranging the qubits 110-178 according to a more dense rectilinear grid rather than a less dense hexagonal grid (e.g., physically arranging the qubits 110-178 in regular and/or repeating rows and columns rather than in hexagons). In other words, the inventors of various embodiments of the invention determined how to reshape the qubit tiles 102-108 so that they can be implemented within a rectilinear physical grid while still exhibiting a heavy-hex connection topology.

Figure 2:
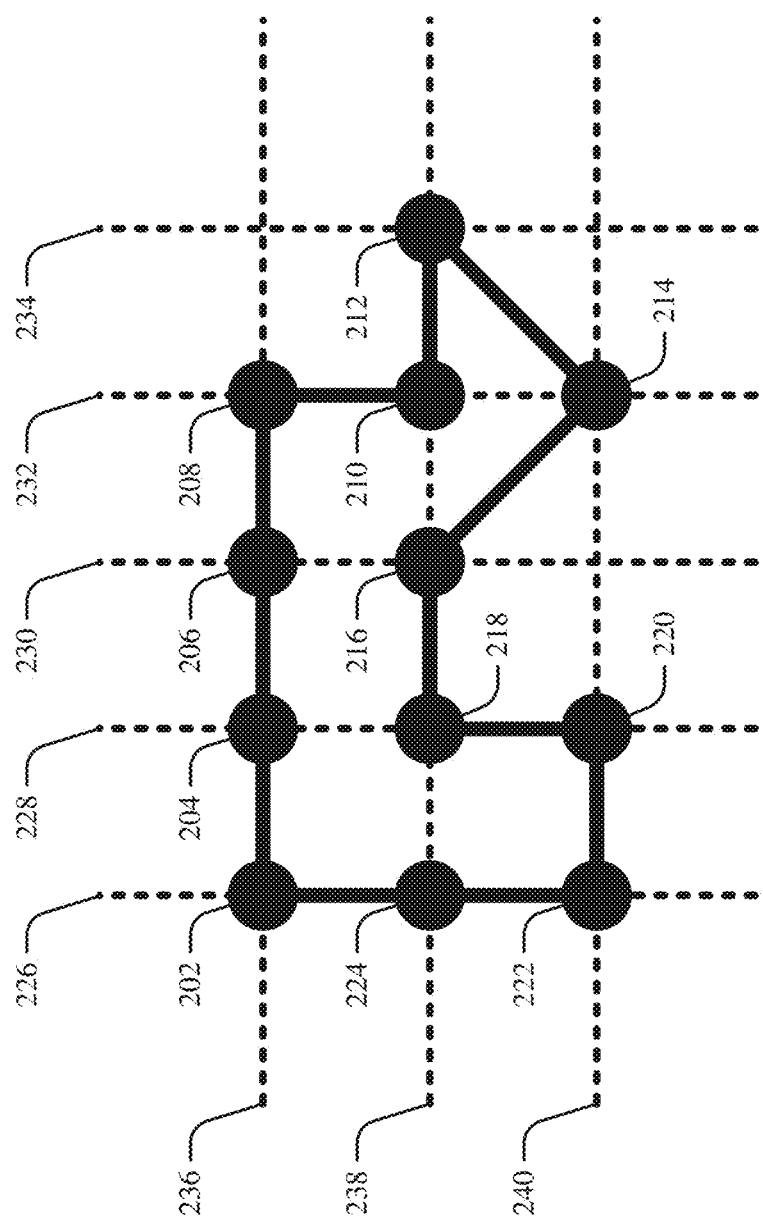
FIG. 2 illustrates a block diagram of an example, non-limiting qubit tile having a first shape that facilitates mapping a heavy-hex qubit connection topology to a rectilinear physical qubit layout in accordance with one or more embodiments described herein.
Figure 3:
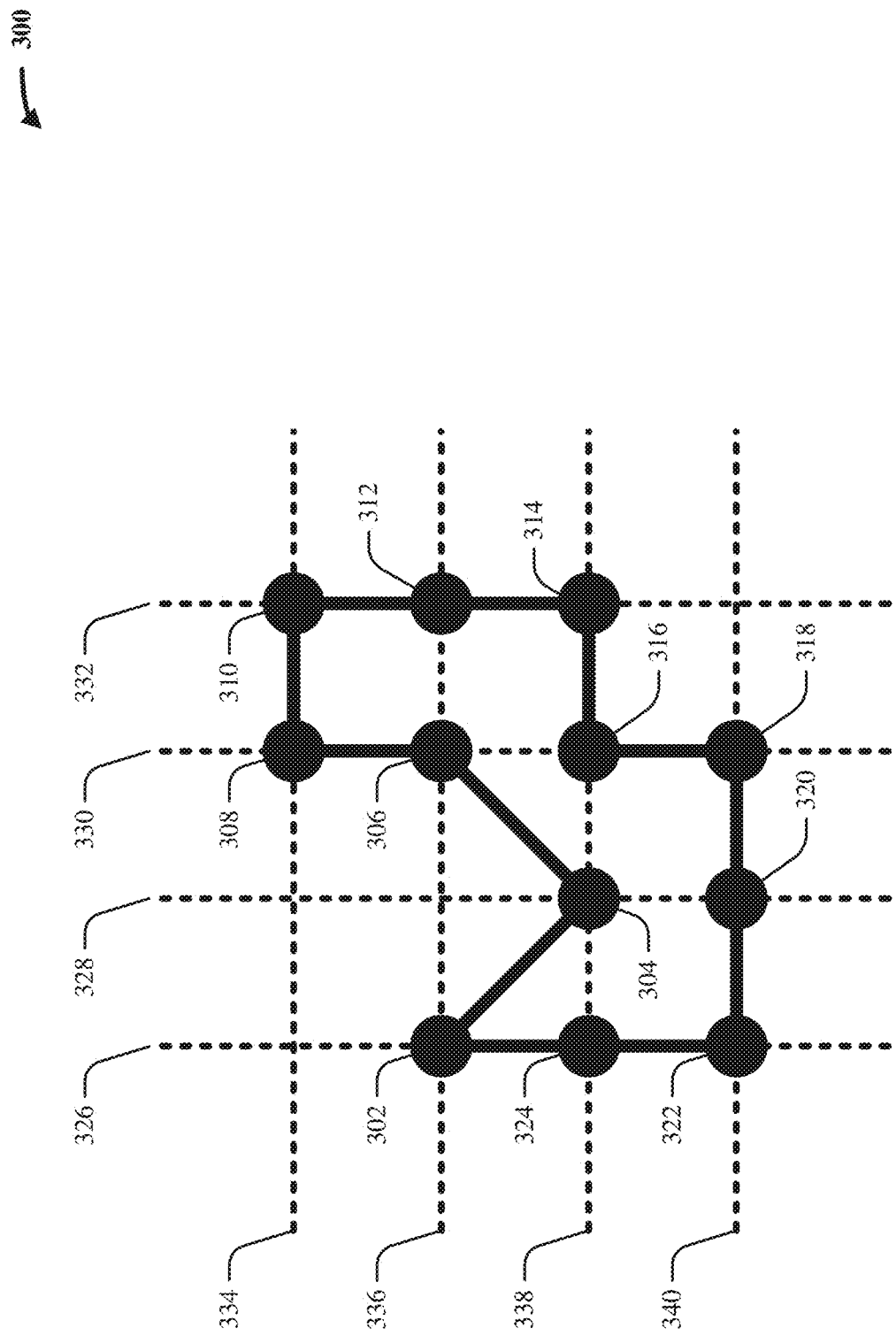
FIG. 3 illustrates a block diagram of an example, non-limiting qubit tile having a second shape that facilitates mapping a heavy-hex qubit connection topology to a rectilinear physical qubit layout in accordance with one or more embodiments described herein.

More specifically, the inventors of various embodiments of the invention determined that the particularly-shaped qubit tiles illustrated in FIG. 2 and in FIG. 3 can be tessellated together so as to map a heavy-hex connection topology to a rectilinear physical layout.

FIG. 2 illustrates a block diagram of an example, non-limiting qubit tile 200 having a first shape that can facilitate mapping a heavy-hex qubit connection topology to a rectilinear physical qubit layout in accordance with one or more embodiments described herein. As shown, the qubit tile 200 can, in various aspects, comprise twelve qubits coupled together in the shape shown in FIG. 2 via twelve interqubit connection buses. More specifically, the qubit tile 200 can comprise the qubit 202, the qubit 204, the qubit 206, the qubit 208, the qubit 210, the qubit 212, the qubit 214, the qubit 216, the qubit 218, the qubit 220, the qubit 222, and the qubit 224. In some embodiments, any other suitable number of qubits can be incorporated into the qubit tile 200. As shown, the qubit 202 can be coupled via an interqubit connection bus to the qubit 204, the qubit 204 can be coupled via an interqubit connection bus to the qubit 206, the qubit 206 can be coupled via an interqubit connection bus to the qubit 208, the qubit 208 can be coupled via an interqubit connection bus to the qubit 210, the qubit 210 can be coupled via an interqubit connection bus to the qubit 212, the qubit 212 can be coupled via an interqubit connection bus to the qubit 214, the qubit 214 can be coupled via an interqubit connection bus to the qubit 216, the qubit 216 can be coupled via an interqubit connection bus to the qubit 218, the qubit 218 can be coupled via an interqubit connection bus to the qubit 220, the qubit 220 can be coupled via an interqubit connection bus to the qubit 222, the qubit 222 can be coupled via an interqubit connection bus to the qubit 224, and the qubit 224 can be coupled via an interqubit connection bus to the qubit 202. In various aspects, this qubit connection topology can be referred to 202-204-206-208-210-212-214-216-218-220-222-224-202.

As shown, in various embodiments, the qubits 202-224 of the qubit tile 200 can be physically positioned and/or located according to a rectilinear grid. Specifically, in various aspects, a rectilinear grid can be defined by columns 226-234 and by rows 236-240, and, in various cases, the qubits 202-224 of the qubit tile 200 can be physically positioned and/or located along the columns 226-234 and along the rows 236-240. In various cases, the columns 226-234 can be regularly spaced apart (e.g., separated by any suitable regular intervals in the horizontal direction of FIG. 2), and the rows 236-240 can be regularly spaced apart (e.g., separated by any suitable regular intervals in the vertical direction of FIG. 2). As shown, the columns 226-234 can be parallel with each other. Similarly, the rows 236-240 can be parallel with each other. As shown, the columns 226-234 can be orthogonal and/or perpendicular to the rows 236-240. In various instances, as shown, the qubit 202, the qubit 224, and the qubit 222 can be physically positioned along the column 226; the qubit 204, the qubit 218, and the qubit 220 can be physically positioned along the column 228; the qubit 206 and the qubit 216 can be physically positioned along the column 230; the qubit 208, the qubit 210, and the qubit 214 can be physically positioned along the column 232; and the qubit 212 can be physically positioned along the column 234. In various aspects, as shown, the qubit 202, the qubit 204, the qubit 206, and the qubit 208 can be physically positioned along the row 236; the qubit 224, the qubit 218, the qubit 216, the qubit 210, and the qubit 212 can be physically positioned along the row 238; and the qubit 222, the qubit 220, and the qubit 214 can be physically positioned along the row 240.

In various cases, the horizontal and/or vertical intervals that separate the columns 226-234 and the rows 236-240 can be chosen and/or selected based on any suitable design criteria. For example, in some cases, the columns 226-234 and the rows 236-240 can be physically arranged so that the qubits 202-224 are densely packed together (e.g., so that the qubits 202-224 are as physically close together as they feasibly and/or practicably can be without experiencing undesired quantum interference with each other). Such a dense packing of the qubits 202-224 can ensure that the qubit tile 200 does not span across an unnecessarily/excessively large amount of surface area (e.g., unlike the hexagonal shapes of the qubit tiles 102-108), which can help to ensure that the qubit tile 200 encompasses little wasted space and/or little wasted quantum chip real estate.

Note that the qubit tile 200 can have a different physical shape than the qubit tiles 102-108. That is, the qubit tile 200 has a particular, irregular physical shape (depicted in FIG. 2) while the qubit tiles 102-108 each have a hexagonal physical shape. However, note that the qubit tile 200, as illustrated, does exhibit the same qubit connection topology as each of the qubit tiles 102-108 (e.g., again, connection topology can be distinct from physical shape/layout). That is, the qubit tile 200 can comprise twelve qubits where each qubit is coupled to two adjacent qubits, thereby forming a twelve-qubit closed loop, just like each of the qubit tiles 102-108. As shown, each qubit in the qubit tile 200 can be coupled to a nearest-neighboring qubit (e.g., the nearest adjacent qubit in the north, south, east, and/or west directions from the given qubit) and/or can be coupled to a next-nearest-neighboring qubit (e.g., the nearest adjacent qubit in the diagonal directions from the given qubit). Overall, the qubit tile 200 can, in various cases, be considered as a heavy-hex cell (e.g., the qubit tile 200 can exhibit the same connection topology as the qubit tiles 102-108 despite not having the same hexagonal physical shape/layout as the qubit tiles 102-108). In various aspects, the particular, irregular physical shape exhibited by the qubit tile 200 can be referred to as a duck-shape (e.g., the qubit tile 200 can be considered as roughly resembling an upside-down duck figure).

FIG. 3 illustrates a block diagram of an example, non-limiting qubit tile 300 having a second shape that can facilitate mapping a heavy-hex qubit connection topology to a rectilinear physical qubit layout in accordance with one or more embodiments described herein. As shown, the qubit tile 300 can, in various aspects, comprise twelve qubits coupled together in the shape shown in FIG. 3 via twelve interqubit connection buses. More specifically, the qubit tile 300 can comprise the qubit 302, the qubit 304, the qubit 306, the qubit 308, the qubit 310, the qubit 312, the qubit 314, the qubit 316, the qubit 318, the qubit 320, the qubit 322, and the qubit 324. In some embodiments, any other suitable number of qubits can be incorporated into the qubit tile 300. As shown, the qubit 302 can be coupled via an interqubit connection bus to the qubit 304, the qubit 304 can be coupled via an interqubit connection bus to the qubit 306, the qubit 306 can be coupled via an interqubit connection bus to the qubit 308, the qubit 308 can be coupled via an interqubit connection bus to the qubit 310, the qubit 310 can be coupled via an interqubit connection bus to the qubit 312, the qubit 312 can be coupled via an interqubit connection bus to the qubit 314, the qubit 314 can be coupled via an interqubit connection bus to the qubit 316, the qubit 316 can be coupled via an interqubit connection bus to the qubit 318, the qubit 318 can be coupled via an interqubit connection bus to the qubit 320, the qubit 320 can be coupled via an interqubit connection bus to the qubit 322, the qubit 322 can be coupled via an interqubit connection bus to the qubit 324, and the qubit 324 can be coupled via an interqubit connection bus to the qubit 302. In various aspects, this qubit connection topology can be referred to 302-304-306-308-310-312-314-316-318-320-322-324-302.

As shown, in various embodiments, the qubits 302-324 of the qubit tile 300 can be physically positioned and/or located according to a rectilinear grid. Specifically, in various aspects, a rectilinear grid can be defined by columns 326-332 and by rows 334-340, and, in various cases, the qubits 302-324 of the qubit tile 300 can be physically positioned and/or located along the columns 326-332 and along the rows 334-340. In various cases, the columns 326-332 can be regularly spaced apart (e.g., separated by any suitable regular intervals in the horizontal direction of FIG. 3), and the rows 334-340 can be regularly spaced apart (e.g., separated by any suitable regular intervals in the vertical direction of FIG. 3). As shown, the columns 326-332 can be parallel with each other. Similarly, the rows 334-340 can be parallel with each other. As shown, the columns 326-332 can be orthogonal and/or perpendicular to the rows 334-340. In various instances, as shown, the qubit 302, the qubit 324, and the qubit 322 can be physically positioned along the column 326; the qubit 304 and the qubit 320 can be physically positioned along the column 328; the qubit 308, the qubit 306, the qubit 316, and the qubit 318 can be physically positioned along the column 330; and the qubit 310, the qubit 312, and the qubit 314 can be physically positioned along the column 332. In various aspects, as shown, the qubit 308 and the qubit 310 can be physically positioned along the row 334; the qubit 302, the qubit 306, the qubit 312 can be physically positioned along the row 336; the qubit 324, the qubit 304, the qubit 316, and the qubit 314 can be physically positioned along the row 338; and the qubit 322, the qubit 320, and the qubit 318 can be physically positioned along the row 340.

In various cases, the horizontal and/or vertical intervals that separate the columns 326-332 and the rows 334-340 can be chosen and/or selected based on any suitable design criteria. For example, in some cases, the columns 326-332 and the rows 334-340 can be physically arranged so that the qubits 302-324 are densely packed together (e.g., so that the qubits 302-324 are as physically close together as they feasibly and/or practicably can be without experiencing undesired quantum interference with each other). Such a dense packing of the qubits 302-324 can ensure that the qubit tile 300 does not span across an unnecessarily/excessively large amount of surface area (e.g., unlike the hexagonal shapes of the qubit tiles 102-108), which can help to ensure that the qubit tile 300 encompasses little wasted space and/or little wasted quantum chip real estate.

Note that the qubit tile 300 can have a different physical shape than the qubit tiles 102-108. That is, the qubit tile 300 has a particular, irregular physical shape (depicted in FIG. 3) while the qubit tiles 102-108 each have a hexagonal physical shape. However, note that the qubit tile 300, as illustrated, does exhibit the same qubit connection topology as each of the qubit tiles 102-108 (e.g., again, connection topology can be distinct from physical shape/layout). That is, the qubit tile 300 can comprise twelve qubits where each qubit is coupled to two adjacent qubits, thereby forming a twelve-qubit closed loop, just like each of the qubit tiles 102-108. As shown, each qubit in the qubit tile 300 can be coupled to a nearest-neighboring qubit (e.g., the nearest adjacent qubit in the north, south, east, and/or west directions from the given qubit) and/or can be coupled to a next-nearest-neighboring qubit (e.g., the nearest adjacent qubit in the diagonal directions from the given qubit). Overall, the qubit tile 300 can, in various cases, be considered as a heavy-hex cell (e.g., the qubit tile 300 can exhibit the same connection topology as the qubit tiles 102-108 despite not having the same hexagonal physical shape/layout as the qubit tiles 102-108). In various aspects, the particular, irregular physical shape exhibited by the qubit tile 300 can be referred to as a cow-shape (e.g., the qubit tile 300 can be considered as roughly resembling a slanted cow figure).

In various embodiments, as shown in the following figures, a plurality of qubit tiles 200 can be tessellated in a rectilinear grid with a plurality of qubit tiles 300, thereby forming a rectilinear physical qubit layout that nevertheless collectively exhibits a heavy-hex qubit connection topology.

Figure 4:
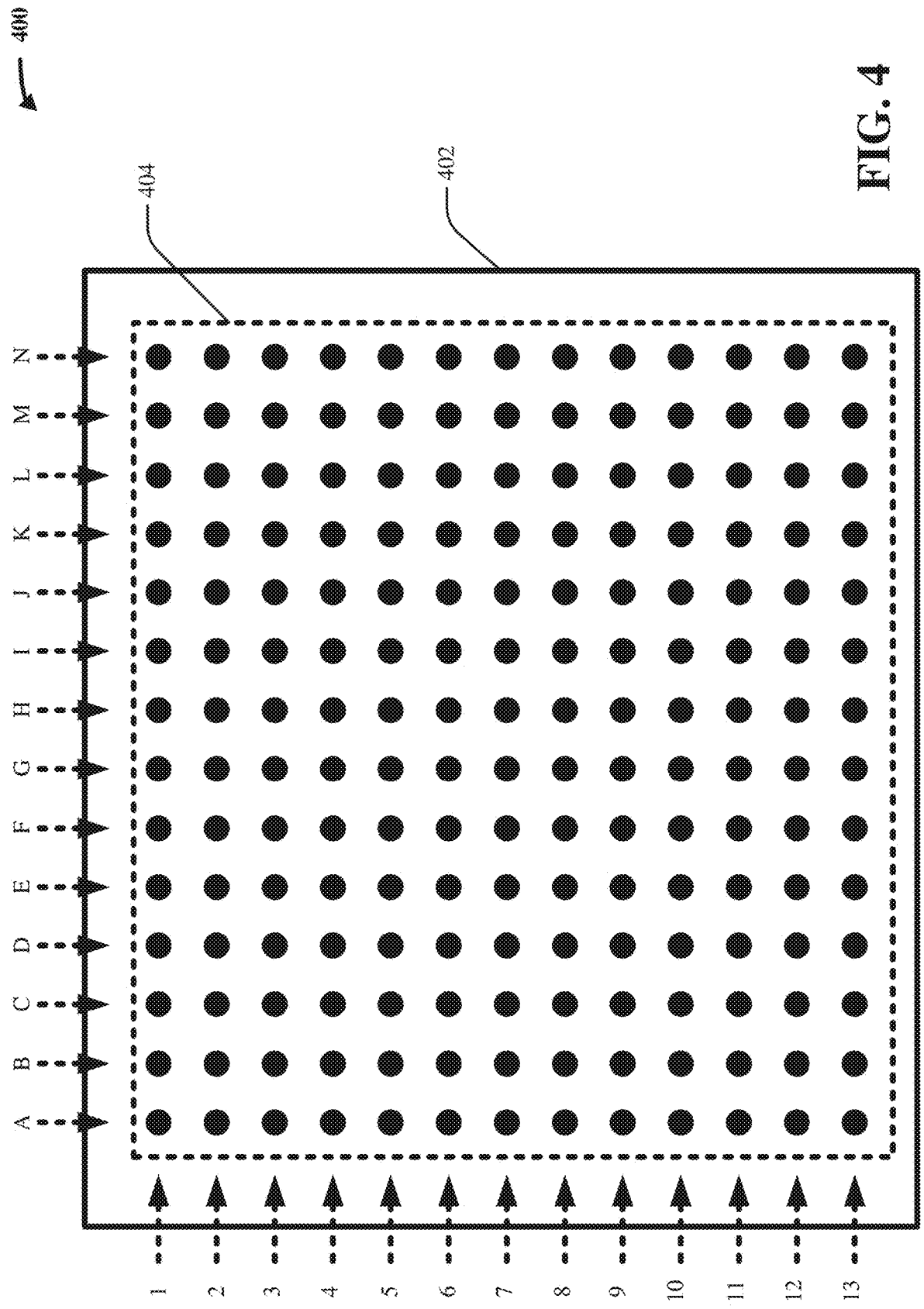
FIG. 4 illustrates a block diagram of an example, non-limiting quantum structure that facilitates mapping a heavy-hex qubit connection topology to a rectilinear physical qubit layout in accordance with one or more embodiments described herein.

FIG. 4 illustrates a block diagram of an example, non-limiting quantum structure 400 that can facilitate mapping a heavy-hex qubit connection topology to a rectilinear physical qubit layout in accordance with one or more embodiments described herein.

In various embodiments, the quantum structure 400 can include a quantum substrate 402. In various aspects, the quantum substrate 402 can be any suitable quantum substrate (e.g., silicon wafer). In various instances, FIG. 4 can be considered as an aerial view of the quantum substrate 402. In various aspects, the quantum substrate 402 can physically support a qubit lattice 404. In various aspects, the qubit lattice 404 can be a rectilinear grid of qubits (with the qubits being denoted by the black dots in FIG. 4) that are fabricated on the surface of the quantum substrate 402. In other words, the qubit lattice 404 can be arranged according to one or more columns A-N and one or more rows 1-13. In various aspects, the qubits of the qubit lattice 404 can be designated by their column and row indices (e.g., qubit A1 can be the upper-left qubit in the qubit lattice 404, qubit N1 can be the upper-right qubit in the qubit lattice 404, qubit A13 can be the lower-left qubit in the qubit lattice 404, and qubit N13 can be the lower-right qubit in the qubit lattice 404).

Although FIG. 4 depicts the qubit lattice 404 as having 182 qubits, this is exemplary and non-limiting only. In various aspects, the qubit lattice 404 can have any suitable number of qubits (e.g., different rows of the qubit lattice 404 can have different numbers of qubits, and/or different columns of the qubit lattice 404 can have different numbers of qubits). Although FIG. 4 depicts the qubit lattice 404 as having 14 columns (e.g., A-N), this is exemplary and non-limiting only. In various instances, the qubit lattice 404 can have any suitable number of columns. Although FIG. 4 depicts the qubit lattice 404 as having 13 rows (e.g., 1-13), this is exemplary and non-limiting only. In various cases, the qubit lattice 404 can have any suitable number of rows.

As explained herein, a plurality of the qubit tiles 200 can be tessellated with a plurality of the qubit tiles 300 within the qubit lattice 404. In various aspects, such tessellation can exhibit a heavy-hex qubit connection topology while simultaneously exhibiting a rectilinear physical qubit layout.

Figure 5:
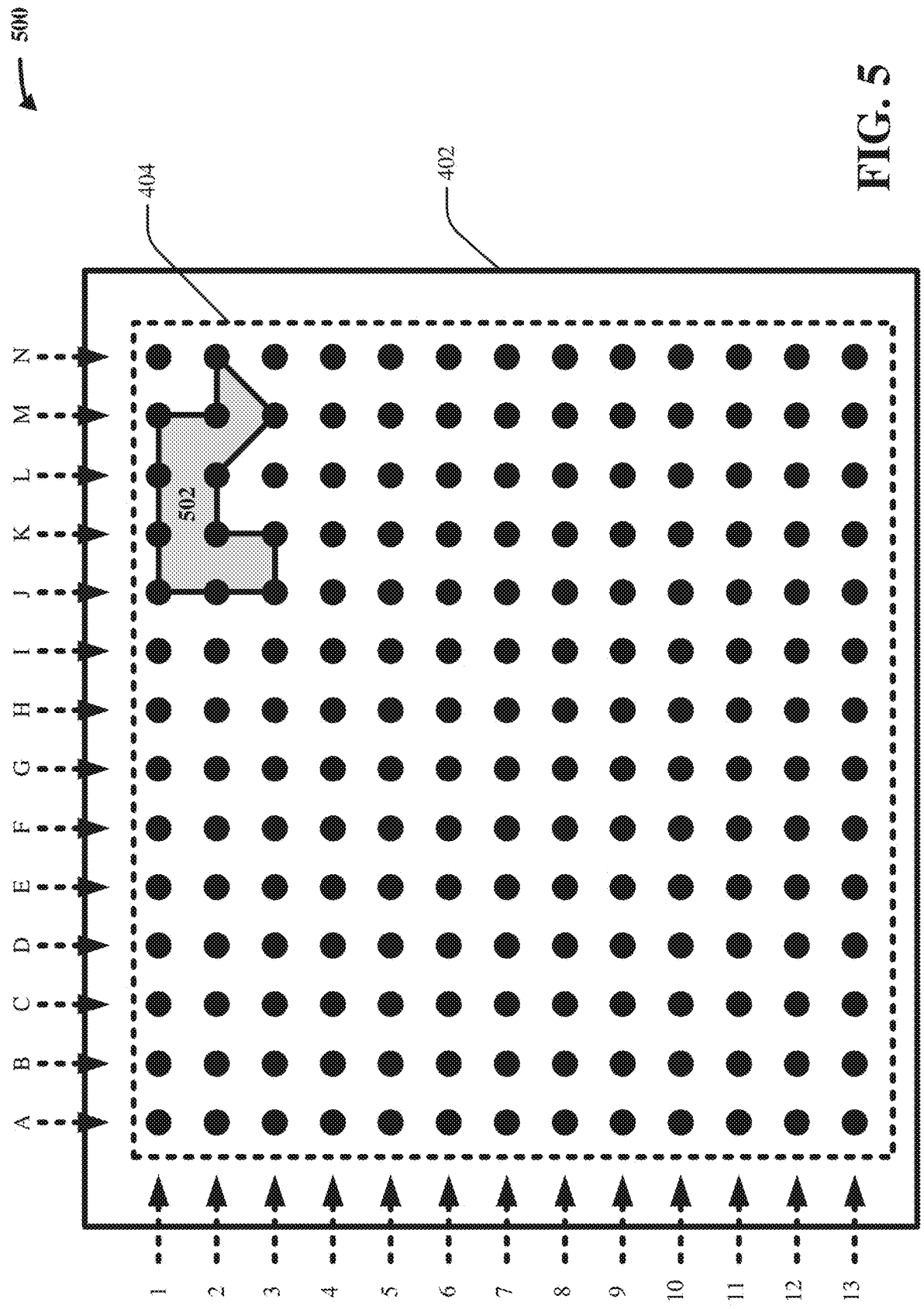
FIG. 5 illustrates a block diagram of an example, non-limiting quantum structure having a qubit tile that facilitates mapping a heavy-hex qubit connection topology to a rectilinear physical qubit layout in accordance with one or more embodiments described herein.

FIG. 5 illustrates a block diagram of an example, non-limiting quantum structure 500 having a qubit tile that can facilitate mapping a heavy-hex qubit connection topology to a rectilinear physical qubit layout in accordance with one or more embodiments described herein.

As shown, a qubit tile 502 can be created within the qubit lattice 404 by fabricating interqubit connection buses (denoted by the black lines in FIG. 5) between various qubits. For instance, the qubit tile 502 can be formed by coupling the qubit J1 to the qubit K1, by coupling the qubit K1 to the qubit L1, by coupling the qubit L1 to the qubit M1, by coupling the qubit M1 to the qubit M2, by coupling the qubit M2 to the qubit N2, by coupling the qubit N2 to the qubit M3, by coupling the qubit M3 to the qubit L2, by coupling the qubit L2 to the qubit K2, by coupling the qubit K2 to the qubit K3, by coupling the qubit K3 to the qubit J3, by coupling the qubit J3 to the qubit J2, and by coupling the qubit J2 to the qubit J1. In various cases, the qubit tile 502 can thus be said to have the following qubit connection topology: J1-K1-L1-M1-M2-N2-M3-L2-K2-K3-J3-J2-J1. In various cases, as shown, the qubit tile 502 can exhibit the duck-shape of the qubit tile 200.

Figure 6:
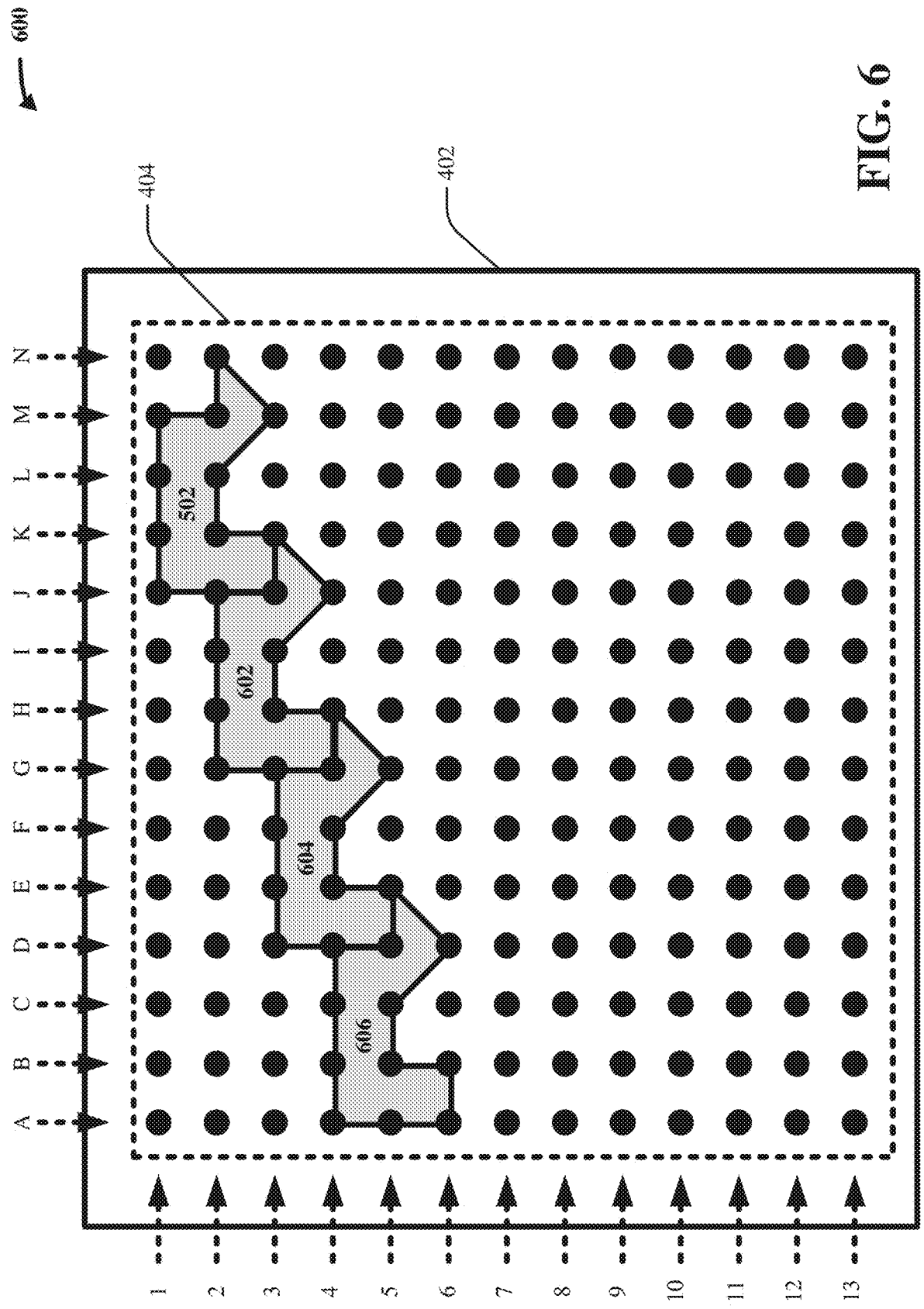
FIG. 6 illustrates a block diagram of an example, non-limiting quantum structure having qubit tiles that facilitates mapping a heavy-hex qubit connection topology to a rectilinear physical qubit layout in accordance with one or more embodiments described herein.

FIG. 6 illustrates a block diagram of an example, non-limiting quantum structure 600 having qubit tiles that can facilitate mapping a heavy-hex qubit connection topology to a rectilinear physical qubit layout in accordance with one or more embodiments described herein.

As shown, additional qubit tiles having the duck-shape of the qubit tile 200 can be formed in the qubit lattice 404. Specifically, in various cases, the qubit tiles 602-606 can be fabricated in the qubit lattice 404 as shown by fabricating interqubit connection buses between various qubits. For instance, as shown, the qubit tile 602 can have the qubit connection topology G2-H2-I2-J2-J3-K3-J4-I3-H3-H4-G4-G3-G2, the qubit tile 604 can have the qubit connection topology D3-E3-F3-G3-G4-H4-G5-F4-E4-E5-D5-D4-D3, and the qubit tile 606 can have the qubit connection topology A4-B4-C4-D4-D5-E5-D6-C5-B5-B6-A6-A5-A4. As shown, in various instances, the qubit tile 502 and the qubit tile 602 can share the qubit J2, the qubit J3, and the qubit K3, and/or can also share the interqubit connection bus that couples the qubit J2 to the qubit J3 and the interqubit connection bus that couples the qubit J3 to the qubit K3. In various aspects, the qubit tile 602 and the qubit tile 604 can share the qubit G3, the qubit G4, and the qubit H4, and/or can also share the interqubit connection bus that couples the qubit G3 to the qubit G4 and the interqubit connection bus that couples the qubit G4 to the qubit H4. In various cases, the qubit tile 604 and the qubit tile 606 can share the qubit D4, the qubit D5, and the qubit E5, and/or can also share the interqubit connection bus that couples the qubit D4 to the qubit D5 and the interqubit connection bus that couples the qubit D5 to the qubit E5. In various cases, as shown, the qubit tiles 602-606 can each exhibit the duck-shape of the qubit tile 200.

Figure 7:
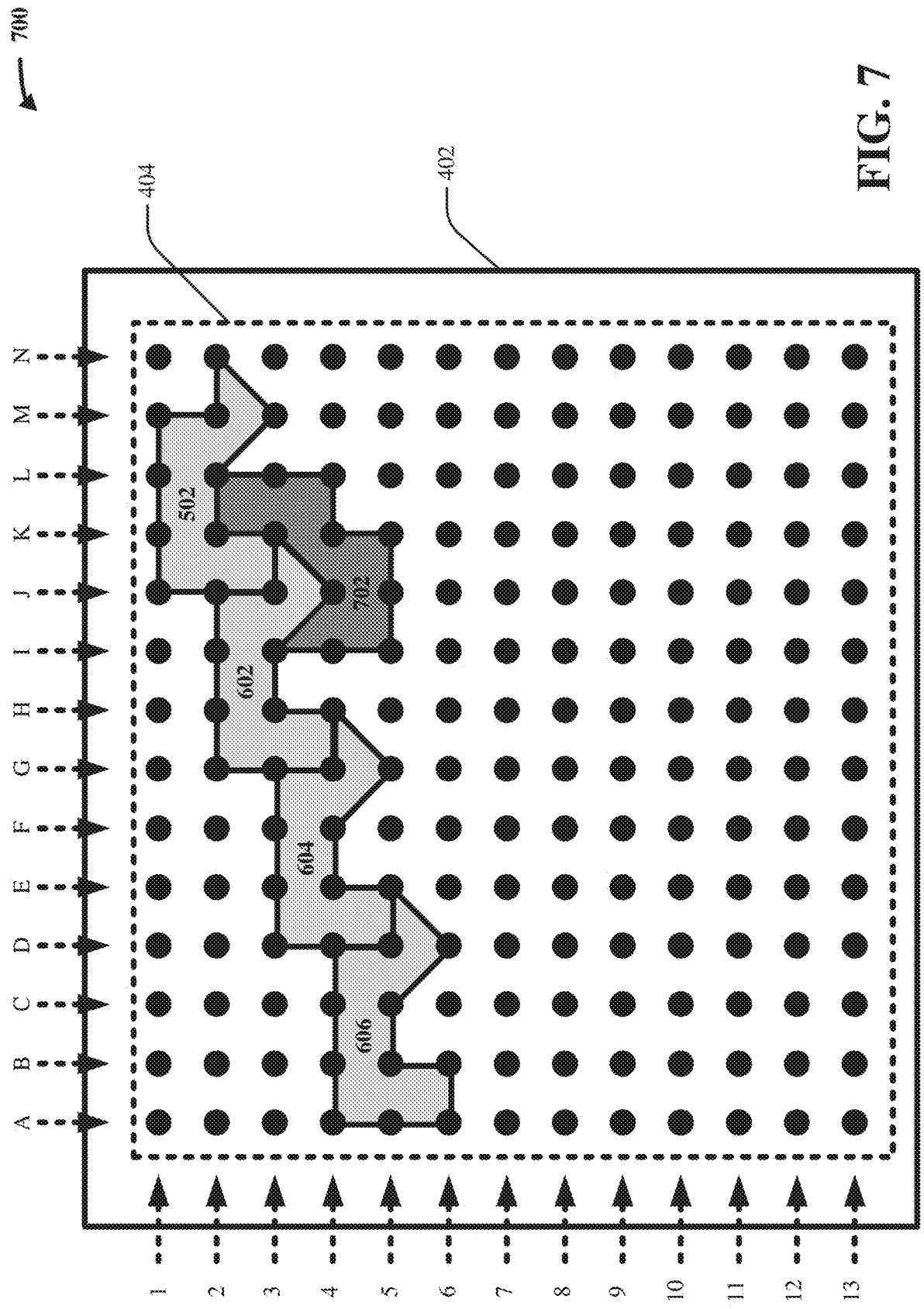
FIG. 7 illustrates a block diagram of an example, non-limiting quantum structure having qubit tiles tessellated with a differently-shaped qubit tile that facilitates mapping a heavy-hex qubit connection topology to a rectilinear physical qubit layout in accordance with one or more embodiments described herein.

FIG. 7 illustrates a block diagram of an example, non-limiting quantum structure 700 having qubit tiles tessellated with a differently-shaped qubit tile that can facilitate mapping a heavy-hex qubit connection topology to a rectilinear physical qubit layout in accordance with one or more embodiments described herein.

As shown, a qubit tile 702 can be created within the qubit lattice 404 by fabricating interqubit connection buses between various qubits. For instance, the qubit tile 702 can have the qubit connection topology I3-J4-K3-K2-L2-L3-L4-K4-K5-J5-I5-I4-I3. In various instances, as shown, the qubit tile 702 and the qubit tile 502 can share the qubit K3, the qubit K2, and the qubit L2, and/or can also share the interqubit connection bus that couples the qubit K3 to the qubit K2 and the interqubit connection bus that couples the qubit K2 to the qubit L2. In various aspects, the qubit tile 702 and the qubit tile 602 can share the qubit I3, the qubit J4, and the qubit K3, and/or can also share the interqubit connection bus that couples the qubit I3 to the qubit J4 and the interqubit connection bus that couples the qubit J4 to the qubit K3. In various cases, as shown, the qubit tile 702 can exhibit the cow-shape of the qubit tile 300.

Figure 8:
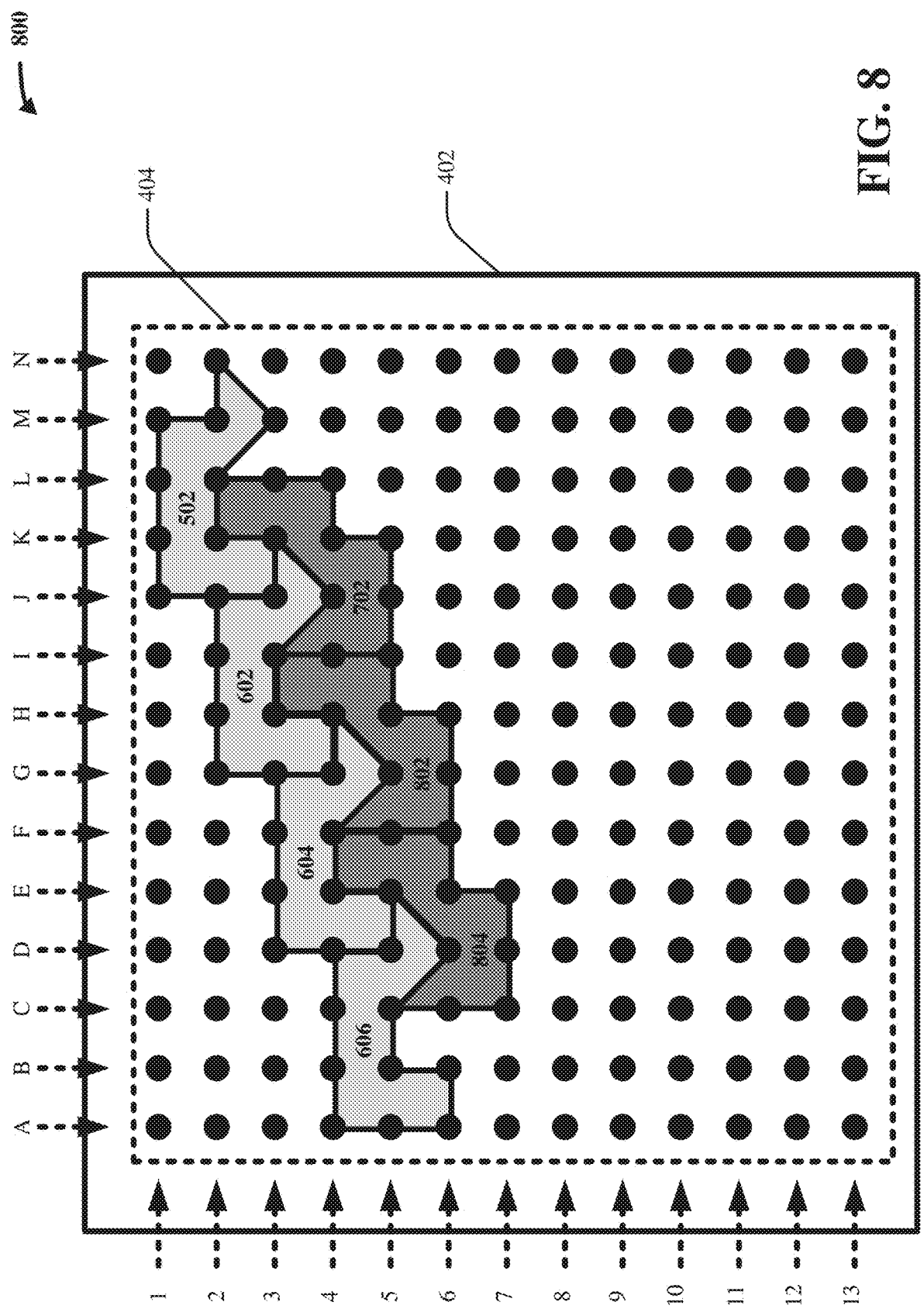
FIG. 8 illustrates a block diagram of an example, non-limiting quantum structure having qubit tiles tessellated with differently-shaped qubit tiles that facilitates mapping a heavy-hex qubit connection topology to a rectilinear physical qubit layout in accordance with one or more embodiments described herein.

FIG. 8 illustrates a block diagram of an example, non-limiting quantum structure 800 having qubit tiles tessellated with differently-shaped qubit tiles that can facilitate mapping a heavy-hex qubit connection topology to a rectilinear physical qubit layout in accordance with one or more embodiments described herein.

As shown, additional qubit tiles having the cow-shape of the qubit tile 300 can be formed in the qubit lattice 404. Specifically, in various cases, the qubit tiles 802-804 can be fabricated in the qubit lattice 404 as shown by fabricating interqubit connection buses between various qubits. For instance, as shown, the qubit tile 802 can have the qubit connection topology F4-G5-H4-H3-I3-I4-I5-H5-H6-G6-F6-F5-F4, and the qubit tile 804 can have the qubit connection topology C5-D6-E5-E4-F4-F5-F6-E6-E7-D7-C7-C6-C5. As shown, in various instances, the qubit tile 802 and the qubit tile 702 can share the qubit I3, the qubit I4, and the qubit I5, and/or can also share the interqubit connection bus that couples the qubit I3 to the qubit I4 and the interqubit connection bus that couples the qubit I4 to the qubit I5. In various aspects, the qubit tile 802 and the qubit tile 602 can share the qubit H4, the qubit H3, and the qubit I3, and/or can also share the interqubit connection bus that couples the qubit H4 to the qubit H3 and the interqubit connection bus that couples the qubit H3 to the qubit I3. In various cases, the qubit tile 802 and the qubit tile 604 can share the qubit F4, the qubit G5, and the qubit H4, and/or can also share the interqubit connection bus that couples the qubit F4 to the qubit G5 and the interqubit connection bus that couples the qubit G5 to the qubit H4. In various instances, the qubit tile 802 and the qubit tile 804 can share the qubit F4, the qubit F5, and the qubit F6, and/or can also share the interqubit connection bus that couples the qubit F4 to the qubit F5 and the interqubit connection bus that couples the qubit F5 to the qubit F6. In various aspects, the qubit tile 804 and the qubit tile 604 can share the qubit E5, the qubit E4, and the qubit F4, and/or can also share the interqubit connection bus that couples the qubit E5 to the qubit E4 and the interqubit connection bus that couples the qubit E4 to the qubit F4. In various cases, the qubit tile 804 and the qubit tile 606 can share the qubit C5, the qubit D6, and the qubit E5, and/or can also share the interqubit connection bus that couples the qubit C5 to the qubit D6 and the interqubit connection bus that couples the qubit D6 to the qubit E5. In various cases, as shown, the qubit tiles 802-804 can each exhibit the cow-shape of the qubit tile 300.

Overall, as shown, qubit tiles having the duck-shape (e.g., the qubit tiles 502, 602, 604, and 606) can be tessellated with qubit tiles having the cow-shape (e.g., the qubit tiles 702, 802, and 804) within the rectilinear grid of the qubit lattice 404. In various cases, this tessellation pattern can be extended to any suitable dimensions, as shown in FIG. 9.

Figure 9:
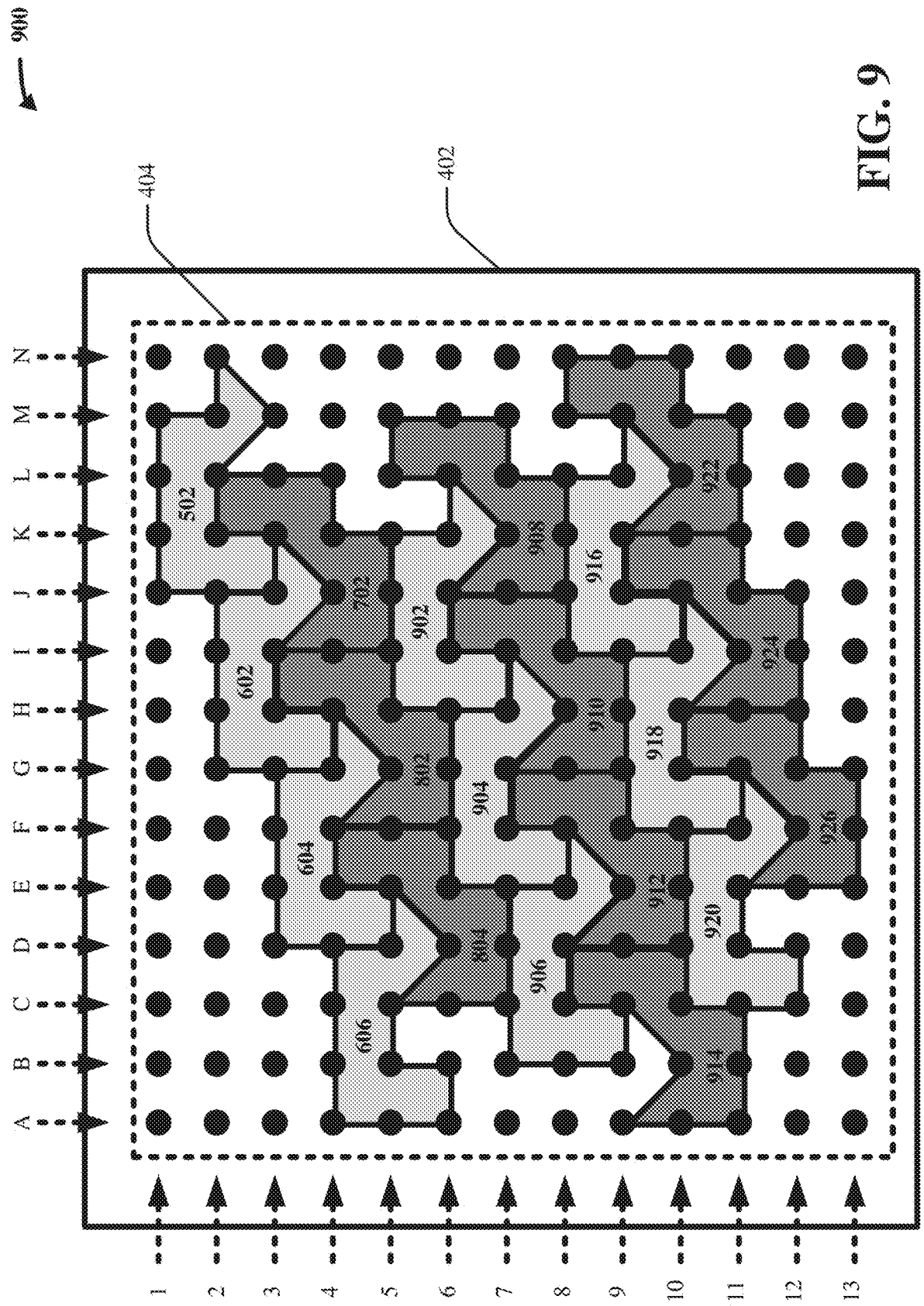
FIG. 9 illustrates a block diagram of an example, non-limiting quantum structure having qubit tiles tessellated with differently-shaped qubit tiles that facilitates mapping a heavy-hex qubit connection topology to a rectilinear physical qubit layout in accordance with one or more embodiments described herein.

FIG. 9 illustrates a block diagram of an example, non-limiting quantum structure 900 having qubit tiles tessellated with differently-shaped qubit tiles that can facilitate mapping a heavy-hex qubit connection topology to a rectilinear physical qubit layout in accordance with one or more embodiments described herein.

As shown, in various embodiments, the tessellation pattern depicted in FIGS. 4-8 can be extended as desired to any suitable dimensions (e.g., which can depend upon the dimensions and/or size of the qubit lattice 404). In various cases, qubit tiles 902-926 can be manufactured in the qubit lattice 404 by fabricating interqubit connection buses between various qubits. As shown, the qubit tiles 902-906 and 916-920 can exhibit the duck-shape of the qubit tile 200, and the qubit tiles 908-914 and 922-926 can exhibit the cow-shape of the qubit tile 300.

As shown, a plurality of qubit tiles having the duck-shape (e.g., qubit tiles 502, 602-606, 902-906, and 916-920) can be tessellated with a plurality of qubit tiles having the cow-shape (e.g., qubit tiles 702, 802-804, 908-914, and 922-926) within the qubit lattice 404. Since the qubit lattice 404 is arranged according to a rectilinear grid (e.g., columns A-N and rows 1-13), the plurality of qubit tiles having the duck-shape tessellated with the plurality of qubit tiles having the cow-shape can collectively be considered as exhibiting a rectilinear physical qubit layout (e.g., the qubits that make up all of these depicted qubit tiles are physically positioned and/or located along orthogonal rows and columns).

However, as shown, the plurality of qubit tiles having the duck-shape tessellated with the plurality of qubit tiles having the cow-shape nevertheless collectively exhibit a heavy-hex qubit connection topology. This can be verified by comparing the qubit connection topology of the qubit lattice 404 with the qubit connection topology exhibited by the heavy-hex physical qubit layout 100. For example, consider the qubit tiles 102, 104, 106, and 108 in the heavy-hex physical qubit layout 100 and consider without loss of generality the qubit tiles 910, 918, 908, and 916 in the qubit lattice 404. As explained above with respect to FIG. 1, the qubit tile 102 can have twelve qubits coupled in a closed-loop via twelve interqubit connection buses, and can share three qubits (and/or two interqubit connection buses) with each of its adjacent neighboring qubit tiles. That is, the qubit tile 102 can share three qubits (e.g., 162, 166, and 168) with the qubit tile 104, the qubit tile 102 can share three qubits (e.g., 172, 174, and 118) with the qubit tile 106, and the qubit tile 102 can share three qubits (e.g., 168, 170, and 172) with the qubit tile 108. Similarly, as shown in FIG. 9, the qubit tile 910 can have twelve qubits coupled in a closed-loop via twelve interqubit connection buses, and can share three qubits (and/or two interqubit connection buses) with each of its adjacent neighboring qubit tiles. That is, the qubit tile 910 can share three qubits (e.g., G9, H9, and I9) with the qubit tile 918, the qubit tile 910 can share three qubits (e.g., J8, J7, and J6) with the qubit tile 908, and the qubit tile 910 can share three qubits (e.g., I9, I8, and J8) with the qubit tile 916.

Moreover, as explained above with respect to FIG. 1, the qubit tile 104 can have twelve qubits coupled in a closed-loop via twelve interqubit connection buses, and can share three qubits (and/or two interqubit connection buses) with each of its adjacent neighboring qubit tiles. That is, the qubit tile 104 can share three qubits (e.g., 162, 166, and 168) with the qubit tile 102, and the qubit tile 104 can share three qubits (e.g., 146, 178, and 168) with the qubit tile 108. Similarly, as shown in FIG. 9, the qubit tile 918 can have twelve qubits coupled in a closed-loop via twelve interqubit connection buses, and can share three qubits (and/or two interqubit connection buses) with each of its adjacent neighboring qubit tiles. That is, the qubit tile 918 can share three qubits (e.g., G9, H9, and I9) with the qubit tile 910, and the qubit tile 918 can share three qubits (e.g., J10, I10, and I9) with the qubit tile 916.

Furthermore, as explained above with respect to FIG. 1, the qubit tile 106 can have twelve qubits coupled in a closed-loop via twelve interqubit connection buses, and can share three qubits (and/or two interqubit connection buses) with each of its adjacent neighboring qubit tiles. That is, the qubit tile 106 can share three qubits (e.g., 172, 174, and 118) with the qubit tile 102, and the qubit tile 106 can share three qubits (e.g., 172, 176, and 134) with the qubit tile 108. Similarly, as shown in FIG. 9, the qubit tile 908 can have twelve qubits coupled in a closed-loop via twelve interqubit connection buses, and can share three qubits (and/or two interqubit connection buses) with each of its adjacent neighboring qubit tiles. That is, the qubit tile 908 can share three qubits (e.g., J8, J7, and J6) with the qubit tile 910, and the qubit tile 908 can share three qubits (e.g., J8, K8, and L8) with the qubit tile 916.

Further still, as explained above with respect to FIG. 1, the qubit tile 108 can have twelve qubits coupled in a closed-loop via twelve interqubit connection buses, and can share three qubits (and/or two interqubit connection buses) with each of its adjacent neighboring qubit tiles. That is, the qubit tile 108 can share three qubits (e.g., 146, 178, and 168) with the qubit tile 104, the qubit tile 108 can share three qubits (e.g., 168, 170, and 172) with the qubit tile 102, and the qubit tile 108 can share three qubits (e.g., 172, 176, and 134) with the qubit tile 106. Similarly, as shown in FIG. 9, the qubit tile 916 can have twelve qubits coupled in a closed-loop via twelve interqubit connection buses, and can share three qubits (and/or two interqubit connection buses) with each of its adjacent neighboring qubit tiles. That is, the qubit tile 916 can share three qubits (e.g., J10, I10, and I9) with the qubit tile 918, the qubit tile 916 can share three qubits (e.g., I9, I8, and J8) with the qubit tile 910, and the qubit tile 916 can share three qubits (e.g., J8, K8, and L8) with the qubit tile 908.

Overall, this can mean that the qubit tiles 910, 918, 908, and 916 can, when tessellated, respectively correspond in a topological sense to the qubit tiles 102, 104, 106, and 108 (e.g., the qubit tile 910 can be topologically analogous to the qubit tile 102, the qubit tile 918 can be topologically analogous to the qubit tile 104, the qubit tile 908 can be topologically analogous to the qubit tile 106, and the qubit tile 916 can be topologically analogous to the qubit tile 108). Since the qubit tiles 910, 918, 908, and 916 are respectively topologically analogous to the qubit tiles 102, 104, 106, and 108, and because the qubit tiles 102, 104, 106, and 108 collectively exhibit a heavy-hex qubit connection topology, it follows that the qubit tiles 910, 918, 908, and 916 also collectively exhibit a heavy-hex qubit connection topology, notwithstanding that the qubit tiles 910, 918, 908, and 916 are not physically shaped, laid out, and/or arranged as hexagons. Moreover, because the above comparison is performed without loss of generality, it can be shown that the entire tessellated qubit tile pattern depicted in FIG. 9 collectively exhibits a heavy-hex qubit connection topology, notwithstanding the absence of hexagonally-shaped qubit tiles.

In other words, the above discussion shows that, in various embodiments, a plurality of duck-shaped (as defined herein) qubit tiles can be tessellated with a plurality of cow-shaped (as defined herein) qubit tiles to ultimately form a qubit lattice that exhibits both a heavy-hex qubit connection topology and a rectilinear physical qubit layout. That is, the qubits in the qubit lattice 404 can be physically arranged in columns A-N and in rows 1-13 (e.g., which constitutes a rectilinear physical layout) rather than being physically arranged in tessellated hexagonal shapes (e.g., which would constitute a hexagonal physical layout). However, the qubits in the qubit lattice 404 nevertheless collectively exhibit a heavy-hex qubit connection topology due to the tessellation of the duck-shaped qubit tiles with the cow-shaped qubit tiles. Because the qubit lattice 404 exhibits a heavy-hex qubit connection topology, heavy-hex-based quantum error correcting codes can execute as desired on the qubit lattice 404. Moreover, because the qubit lattice 404 is physically structured according to a rectilinear physical qubit layout as opposed to a hexagonal physical qubit layout, the qubit lattice 404 can have and/or encompass less unused/wasted space, less unused/wasted quantum chip real estate, and/or less unused/wasted surface area of the quantum substrate 402. Thus, fabrication costs associated with the quantum structure 900 can be reduced, resonant frequencies of the interqubit connection buses implemented within the quantum structure 900 can be more easily controlled and/or kept within desired operating ranges, and/or parasitic radio frequency modes of the quantum structure 900 can be reduced.

In some cases, various generalizable characteristics of the qubit lattice 404 in the quantum structure 900 can be determined. For instance, in various aspects, each qubit tile in the qubit lattice 404, whether duck-shaped or cow-shaped, can comprise twelve qubits that are coupled in a closed-loop fashion via twelve interqubit connection buses. Moreover, in various instances, adjacent qubit tiles in the qubit lattice 404, whether duck-shaped or cow-shaped, can share with each other three qubits and/or two interqubit connection buses. Furthermore, in various cases, if a given qubit tile in the qubit lattice 404 is fully surrounded by neighboring qubit tiles (e.g., if the given qubit tile is on the interior of the qubit lattice 404 and is not on the edge and/or periphery of the qubit lattice 404), the given qubit tile can be adjacent to six qubit tiles. For example, as shown in FIG. 9, the qubit tile 912 is fully surrounded by a total of six neighboring qubit tiles (e.g., 906, 904, 910, 918, 920, and 914). In contrast, the qubit tile 914 can be considered to be not fully surrounded by neighboring qubit tiles because the qubit tile 914 is adjacent to fewer than six qubit tiles (e.g., 914 is adjacent only to 906, 912, and 920). Further still, in various aspects, if a given qubit tile in the qubit lattice 404 is fully surrounded by neighboring qubit tiles, the given qubit tile can be adjacent to four qubit tiles that have a different shape than the given qubit tile, and the given qubit tile can be adjacent to two qubit tiles that have a same shape as the given qubit tile. For example, as shown in FIG. 9, the qubit tile 912 is fully surrounded by the qubit tiles 906, 904, 910, 918, 920, and 914, and the qubit tile 912 has a cow-shape. As shown, four of the neighboring qubit tiles have a duck-shape (e.g., 906, 904, 918, and 920) and two of the neighboring qubit tiles have a cow-shape (e.g., 910 and 914).

In various aspects, tessellation of duck-shaped qubit tiles with cow-shaped qubit tiles as described herein can be regular and repeatable. That is, in various cases, tessellation of duck-shaped qubit tiles with cow-shaped qubit tiles can be continued, extended, and/or scaled to any suitable size and/or dimensions of the qubit lattice 404. In other words, various embodiments of the invention can facilitate the manufacture of any size rectilinear qubit grid exhibiting a heavy-hex qubit connection topology.

In various instances, once the desired grid-size and/or tessellation size is achieved, unused qubits around the perimeter of the qubit lattice 404 (e.g., qubits in the qubit lattice 404 that are not included in any qubit tile) can be moved and/or removed to clean up and/or improve edge efficiency. In some cases, extra ancilla qubits can be added around the edges of the qubit lattice 404.

Note that FIGS. 4-9 are exemplary and non-limiting only. In various cases, FIGS. 4-9 do not necessarily illustrate the exact order in which various quantum computing components (e.g., qubits, interqubit connection buses) would be fabricated. For example, in some cases, the qubits themselves can be formed on the quantum substrate 402 before the interqubit connection buses are formed on the quantum substrate 402. In other cases, the interqubit connection buses and/or other quantum circuitry can be formed on the quantum substrate 402 before the qubits are formed on the quantum substrate 402. In still other cases, any other suitable manufacturing and/or fabrication order can be implemented. In various instances, any suitable microfabrication and/or nanofabrication techniques can be implemented to create the quantum substrate 402, the qubits in the qubit lattice 404, and/or the interqubit connection buses in the qubit lattice 404 that yield the tessellated qubit tiles described herein (e.g., deposition, evaporation, etching, lithography).

Figure 10:
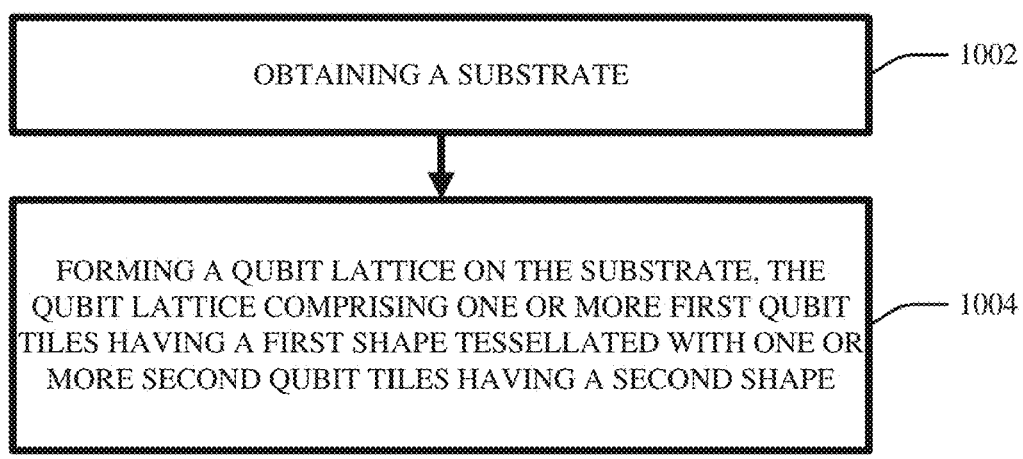
FIG. 10 illustrates a flow diagram of an example, non-limiting method that facilitates mapping a heavy-hex qubit connection topology to a rectilinear physical qubit layout in accordance with one or more embodiments described herein.

FIG. 10 illustrates a flow diagram of an example, non-limiting method 1000 that can facilitate mapping a heavy-hex qubit connection topology to a rectilinear physical qubit layout in accordance with one or more embodiments described herein.

In various embodiments, act 1002 can include obtaining (e.g., and/or forming), by a quantum fabrication device, a substrate (e.g., 402).

In various instances, act 1004 can include forming, by the quantum fabrication device, a qubit lattice (e.g., 404) on the substrate. In various cases, the qubit lattice can comprise one or more first qubit tiles (e.g., 502, 602-606, 902-906, 916-920) having a first shape (e.g., the duck-shape of 200) tessellated with one or more second qubit tiles (e.g., 702, 802-804, 908-914, 922-926) having a second shape (e.g., the cow-shape of 300). In various aspects, the qubit lattice can exhibit a rectilinear physical layout (e.g., columns A-N and/or rows 1-13). In various instances, the one or more first qubit tiles tessellated with the one or more second qubit tiles can form a heavy-hex qubit connection topology in the rectilinear physical layout of the qubit lattice. In various embodiments, one of the one or more first qubit tiles can have twelve qubits and twelve interqubit connection buses. Similarly, in various cases, one of the one or more second qubit tiles can have twelve qubits and twelve interqubit connection buses. In various cases, adjacent qubit tiles in the heavy-hex qubit connection topology can share three qubits and/or two interqubit connection buses. In various instances, a qubit tile in the heavy-hex qubit connection topology can be adjacent to four qubit tiles having a different shape than the qubit tile, and can be adjacent to two qubit tiles having a same shape as the qubit tile.

Various embodiments discussed above teach how duck-shaped qubit tiles and cow-shaped qubit tiles can be tessellated to form a rectilinear physical qubit lattice that exhibits a heavy-hex qubit connection topology. However, in various cases, it is possible that other shapes can be implemented to form a rectilinear physical qubit lattice that exhibits a heavy-hex qubit connection topology. For instance, in various aspects, two or more sets of differently-shaped qubit tiles can be tessellated to form a rectilinear physical qubit lattice that exhibits a heavy-hex qubit connection topology, if the two or more sets of differently-shaped qubit tiles are physically shaped so that each qubit tile is in the form of a closed-loop of interconnected qubits, so that adjacent qubit tiles share three qubits and two interqubit connections, and/or so that a qubit tile can have a maximum of six adjacent neighboring qubit tiles.

In various embodiments, a heavy-hex qubit grid can be a grid of qubits that is composed of hexagons, where a qubit is located at the vertex of each hexagon, and where an extra qubit is located on each line segment between the vertices of each hexagon. In various cases, quantum error correcting codes can be used for improving fidelity of quantum computers. In various instances, a heavy-hex code can be a quantum error correcting code that is designed to run on a topology where qubits exhibit a heavy-hex connection topology. In circuit quantum electro-dynamics, quantum chips (e.g., quantum computing chips and/or quantum processing chips) with a heavy-hex qubit connection topology can be useful for implementing quantum error correcting codes for error correction. Such a heavy-hex qubit connection topology can be facilitated by a heavy-hex physical qubit layout. However, a heavy-hex physical qubit layout can be spatially inefficient, which can result in increased fabrication costs, wasted quantum chip real estate, transmission line resonant frequencies that are not within desired ranges, and/or presence of parasitic radio frequency modes.

Various embodiments of the invention can address one or more of these technical problems by providing a rectilinear physical qubit layout that is more dense and/or spatially efficient than a heavy-hex physical qubit layout, but that nevertheless exhibits a heavy-hex qubit connection topology. In various cases, qubits can be placed on a rectilinear (e.g., square, rectangular, orthogonal) grid on a quantum substrate, and two geometric primitive qubit tiles (e.g., two fundamental and/or irreducible qubit tiles having distinct geometric shapes), each representing a heavy-hex unit cell, can be tessellated, tiled, and/or interlocked as described herein. By tessellating, tiling, and/or interlocking these geometric primitive qubit tiles, a rectilinear physical qubit grid of any suitable size and/or dimensions can be created that exhibits a heavy-hex qubit connection topology. Once the desired size of the rectilinear grid is laid out using the tiles, the qubits around the edges, perimeter, and/or periphery can be moved and/or removed to clean up edge efficiency. In some cases, extra ancilla qubits can be added around the edges, perimeter, and/or periphery. In other words, dangling qubits and/or buses at the edge of the tiling can be moved to unused neighboring sites to further compact the layout. In various cases, the rectilinear physical qubit layout can be denser and/or more regular than a heavy-hex physical qubit layout, which can result in performance benefits and/or reduced costs associated with the quantum computing system.

Figure 11:
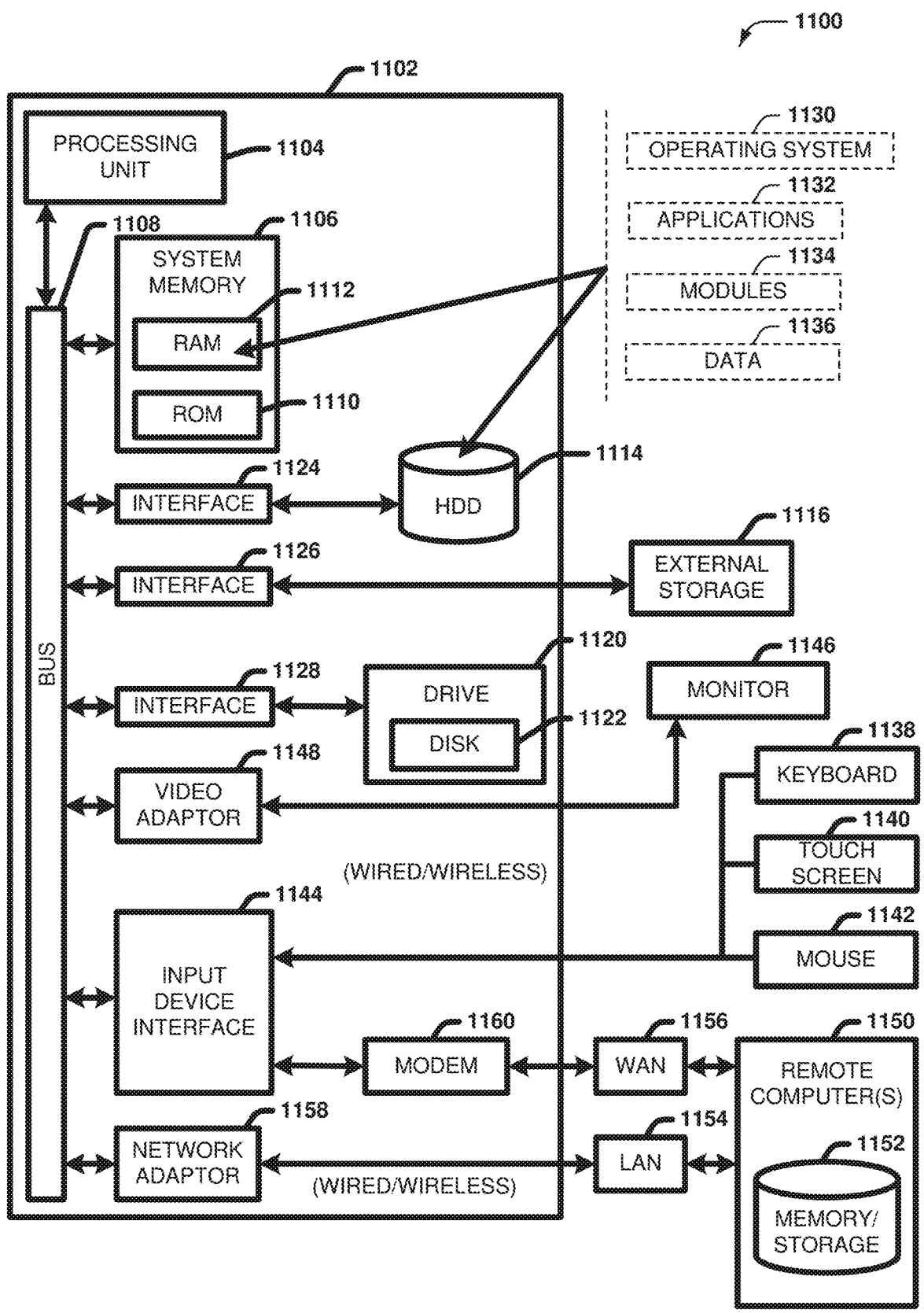
FIG. 11 illustrates a block diagram of an example, non-limiting operating environment in which one or more embodiments described herein can be facilitated.

In order to provide additional context for various embodiments described herein, FIG. 11 and the following discussion are intended to provide a general description of a suitable computing environment 1100 in which the various embodiments of the embodiment described herein can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and the like, each of which can be operatively coupled to one or more associated devices.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory (RAM), read only memory (ROM), electrically erasable programmable read only memory (EEPROM), flash memory or other memory technology, compact disk read only memory (CD-ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 11, the example environment 1100 for implementing various embodiments of the aspects described herein includes a computer 1102, the computer 1102 including a processing unit 1104, a system memory 1106 and a system bus 1108. The system bus 1108 couples system components including, but not limited to, the system memory 1106 to the processing unit 1104. The processing unit 1104 can be any of various commercially available processors. Dual microprocessors and other multi-processor architectures can also be employed as the processing unit 1104.

The system bus 1108 can be any of several types of bus structure that can further interconnect to a memory bus (with or without a memory controller), a peripheral bus, and a local bus using any of a variety of commercially available bus architectures. The system memory 1106 includes ROM 1110 and RAM 1112. A basic input/output system (BIOS) can be stored in a non-volatile memory such as ROM, erasable programmable read only memory (EPROM), EEPROM, which BIOS contains the basic routines that help to transfer information between elements within the computer 1102, such as during startup. The RAM 1112 can also include a high-speed RAM such as static RAM for caching data.

The computer 1102 further includes an internal hard disk drive (HDD) 1114 (e.g., EIDE, SATA), one or more external storage devices 1116 (e.g., a magnetic floppy disk drive (FDD) 1116, a memory stick or flash drive reader, a memory card reader, etc.) and a drive 1120, e.g., such as a solid state drive, an optical disk drive, which can read or write from a disk 1122, such as a CD-ROM disc, a DVD, a BD, etc. Alternatively, where a solid state drive is involved, disk 1122 would not be included, unless separate. While the internal HDD 1114 is illustrated as located within the computer 1102, the internal HDD 1114 can also be configured for external use in a suitable chassis (not shown). Additionally, while not shown in environment 1100, a solid state drive (SSD) could be used in addition to, or in place of, an HDD 1114. The HDD 1114, external storage device(s) 1116 and drive 1120 can be connected to the system bus 1108 by an HDD interface 1124, an external storage interface 1126 and a drive interface 1128, respectively. The interface 1124 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 1102, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 1112, including an operating system 1130, one or more application programs 1132, other program modules 1134 and program data 1136. All or portions of the operating system, applications, modules, and/or data can also be cached in the RAM 1112. The systems and methods described herein can be implemented utilizing various commercially available operating systems or combinations of operating systems.

Computer 1102 can optionally comprise emulation technologies. For example, a hypervisor (not shown) or other intermediary can emulate a hardware environment for operating system 1130, and the emulated hardware can optionally be different from the hardware illustrated in FIG. 11. In such an embodiment, operating system 1130 can comprise one virtual machine (VM) of multiple VMs hosted at computer 1102. Furthermore, operating system 1130 can provide runtime environments, such as the Java runtime environment or the .NET framework, for applications 1132. Runtime environments are consistent execution environments that allow applications 1132 to run on any operating system that includes the runtime environment. Similarly, operating system 1130 can support containers, and applications 1132 can be in the form of containers, which are lightweight, standalone, executable packages of software that include, e.g., code, runtime, system tools, system libraries and settings for an application.

Further, computer 1102 can be enable with a security module, such as a trusted processing module (TPM). For instance with a TPM, boot components hash next in time boot components, and wait for a match of results to secured values, before loading a next boot component. This process can take place at any layer in the code execution stack of computer 1102, e.g., applied at the application execution level or at the operating system (OS) kernel level, thereby enabling security at any level of code execution.

A user can enter commands and information into the computer 1102 through one or more wired/wireless input devices, e.g., a keyboard 1138, a touch screen 1140, and a pointing device, such as a mouse 1142. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 1104 through an input device interface 1144 that can be coupled to the system bus 1108, but can be connected by other interfaces, such as a parallel port, an IEEE 1394 serial port, a game port, a USB port, an IR interface, a BLUETOOTH® interface, etc.

A monitor 1146 or other type of display device can be also connected to the system bus 1108 via an interface, such as a video adapter 1148. In addition to the monitor 1146, a computer typically includes other peripheral output devices (not shown), such as speakers, printers, etc.

The computer 1102 can operate in a networked environment using logical connections via wired and/or wireless communications to one or more remote computers, such as a remote computer(s) 1150. The remote computer(s) 1150 can be a workstation, a server computer, a router, a personal computer, portable computer, microprocessor-based entertainment appliance, a peer device or other common network node, and typically includes many or all of the elements described relative to the computer 1102, although, for purposes of brevity, only a memory/storage device 1152 is illustrated. The logical connections depicted include wired/wireless connectivity to a local area network (LAN) 1154 and/or larger networks, e.g., a wide area network (WAN) 1156. Such LAN and WAN networking environments are commonplace in offices and companies, and facilitate enterprise-wide computer networks, such as intranets, all of which can connect to a global communications network, e.g., the Internet.

When used in a LAN networking environment, the computer 1102 can be connected to the local network 1154 through a wired and/or wireless communication network interface or adapter 1158. The adapter 1158 can facilitate wired or wireless communication to the LAN 1154, which can also include a wireless access point (AP) disposed thereon for communicating with the adapter 1158 in a wireless mode.

When used in a WAN networking environment, the computer 1102 can include a modem 1160 or can be connected to a communications server on the WAN 1156 via other means for establishing communications over the WAN 1156, such as by way of the Internet. The modem 1160, which can be internal or external and a wired or wireless device, can be connected to the system bus 1108 via the input device interface 1144. In a networked environment, program modules depicted relative to the computer 1102 or portions thereof, can be stored in the remote memory/storage device 1152. It will be appreciated that the network connections shown are example and other means of establishing a communications link between the computers can be used.

When used in either a LAN or WAN networking environment, the computer 1102 can access cloud storage systems or other network-based storage systems in addition to, or in place of, external storage devices 1116 as described above, such as but not limited to a network virtual machine providing one or more aspects of storage or processing of information. Generally, a connection between the computer 1102 and a cloud storage system can be established over a LAN 1154 or WAN 1156 e.g., by the adapter 1158 or modem 1160, respectively. Upon connecting the computer 1102 to an associated cloud storage system, the external storage interface 1126 can, with the aid of the adapter 1158 and/or modem 1160, manage storage provided by the cloud storage system as it would other types of external storage. For instance, the external storage interface 1126 can be configured to provide access to cloud storage sources as if those sources were physically connected to the computer 1102.

The computer 1102 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity (Wi-Fi) and BLUETOOTH® wireless technologies. Thus, the communication can be a predefined structure as with a conventional network or simply an ad hoc communication between at least two devices.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adaptor card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
a qubit lattice on a substrate, the qubit lattice comprising one or more first qubit tiles having a first shape tessellated with one or more second qubit tiles having a second shape, wherein the first shape is different from the second shape, wherein the first shape and the second shape are not hexagonal shapes, wherein one of the one or more first qubit tiles has twelve qubits and twelve interqubit connection buses, and wherein one of the one or more second qubit tiles has twelve qubits and twelve interqubit connection buses.

2. The device of claim 1, wherein the qubit lattice exhibits a rectilinear physical layout.

3. The device of claim 1, wherein the one or more first qubit tiles tessellated with the one or more second qubit tiles form a heavy-hex qubit connection topology in a rectilinear physical layout of the qubit lattice.

4. The device of claim 3, wherein adjacent qubit tiles in the heavy-hex qubit connection topology share three qubits.

5. The device of claim 4, wherein a qubit tile in the heavy-hex qubit connection topology is adjacent to four qubit tiles having a different shape than the qubit tile, and is adjacent to two qubit tiles having a same shape as the qubit tile.

6. The device of claim 1, wherein the first shape of the one or more first qubit tiles is illustrated below:

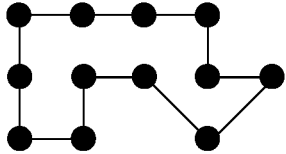

wherein dots represent qubits and wherein lines represent interqubit connection buses.

7. The device of claim 1, wherein the second shape of the one or more second qubit tiles is illustrated below:

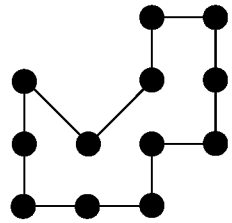

wherein dots represent qubits and wherein lines represent interqubit connection buses.

8. A method, comprising:
forming a qubit lattice on a substrate, the qubit lattice comprising one or more first qubit tiles having a first shape tessellated with one or more second qubit tiles having a second shape, wherein the first shape is different from the second shape, wherein the first shape and the second shape are not hexagonal shapes, wherein one of the one or more first qubit tiles has twelve qubits and twelve interqubit connection buses, and wherein one of the one or more second qubit tiles has twelve qubits and twelve interqubit connection buses.

9. The method of claim 8, wherein the qubit lattice exhibits a rectilinear physical layout.

10. The method of claim 8, wherein the one or more first qubit tiles tessellated with the one or more second qubit tiles form a heavy-hex qubit connection topology in a rectilinear physical layout of the qubit lattice.

11. The method of claim 10, wherein adjacent qubit tiles in the heavy-hex qubit connection topology share three qubits.

12. The method of claim 11, wherein a qubit tile in the heavy-hex qubit connection topology is adjacent to four qubit tiles having a different shape than the qubit tile, and is adjacent to two qubit tiles having a same shape as the qubit tile.

13. The method of claim 8, wherein the first shape of the one or more first qubit tiles is illustrated below:

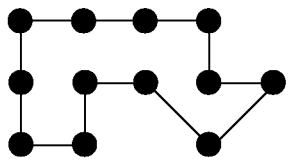

wherein dots represent qubits and wherein lines represent interqubit connection buses.

14. The method of claim 8, wherein the second shape of the one or more second qubit tiles is illustrated below:

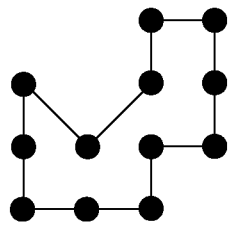

wherein dots represent qubits and wherein lines represent interqubit connection buses.

15. An apparatus, comprising:
a qubit array on a substrate, the qubit array exhibiting a rectilinear physical qubit arrangement, and the qubit array comprising a plurality of first qubit tiles having a first shape tessellated with a plurality of second qubit tiles having a second shape, wherein the first shape is different from the second shape, wherein the first shape and the second shape are not hexagonal shapes, wherein one of the one or more first qubit tiles has twelve qubits and twelve interqubit connection buses, and wherein one of the one or more second qubit tiles has twelve qubits and twelve interqubit connection buses.

16. The apparatus of claim 15, wherein the plurality of first qubit tiles tessellated with the plurality of second qubit tiles form a heavy-hex qubit connection topology in the rectilinear physical qubit arrangement of the qubit array.

17. The apparatus of claim 15, wherein the first shape of the plurality of first qubit tiles is illustrated below:

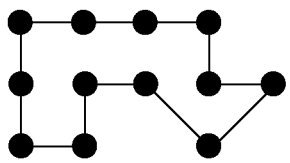

wherein dots represent qubits and wherein lines represent interqubit connection buses.

18. The apparatus of claim 15, wherein the second shape of the plurality of second qubit tiles is illustrated below:

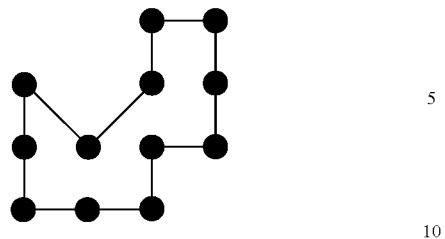

wherein dots represent qubits and wherein lines represent interqubit connection buses.

19. The device of claim 1, wherein a first triangular shape formed by three qubits of the first shape aligns with a second triangular shape formed by three qubits of the second shape.

20. The method of claim 8, wherein a first triangular shape formed by three qubits of the first shape aligns with a second triangular shape formed by three qubits of the second shape.

\* \* \* \* \*